United States Patent
Lee et al.

(10) Patent No.: US 12,538,496 B2
(45) Date of Patent: Jan. 27, 2026

(54) NONVOLATILE MEMORY DEVICES HAVING MAGNETIC TUNNEL JUNCTION MEMORY CELLS THEREIN

(71) Applicant: Samsung Electronics Co., Ltd., Suwon-si (KR)

(72) Inventors: Kil Ho Lee, Hwaseong-si (KR); Gwan Hyeob Koh, Seoul (KR); Yong Jae Kim, Seongnam-si (KR); Geon Hee Bae, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 564 days.

(21) Appl. No.: 17/486,034

(22) Filed: Sep. 27, 2021

(65) Prior Publication Data

US 2022/0246837 A1     Aug. 4, 2022

(30) Foreign Application Priority Data

Feb. 4, 2021 (KR) ........................ 10-2021-0015833

(51) Int. Cl.
| | |
|---|---|
| *H10B 61/00* | (2023.01) |
| *H10N 50/01* | (2023.01) |
| *H10N 50/80* | (2023.01) |
| *H10N 50/85* | (2023.01) |

(52) U.S. Cl.
CPC ............ *H10B 61/22* (2023.02); *H10N 50/01* (2023.02); *H10N 50/80* (2023.02); *H10N 50/85* (2023.02)

(58) Field of Classification Search
CPC ........ H10N 50/80; H10N 50/01; H10N 50/10; H10N 50/85; H10B 61/22; H10B 61/00
See application file for complete search history.

(56) References Cited

U.S. PATENT DOCUMENTS

| | | | |
|---|---|---|---|
| 9,385,308 B2 * | 7/2016 | Li | ........................ H10N 50/01 |
| 10,121,964 B2 | 11/2018 | Tan et al. | |
| 10,608,046 B2 | 3/2020 | Yi et al. | |
| 10,804,320 B2 | 10/2020 | Han et al. | |

(Continued)

FOREIGN PATENT DOCUMENTS

| | | |
|---|---|---|
| KR | 20150128663 A | 11/2015 |
| KR | 20180087976 A | 8/2018 |

(Continued)

*Primary Examiner* — Fernando L Toledo
*Assistant Examiner* — Marshall Mu-Nuo Hatfield
(74) *Attorney, Agent, or Firm* — Wolf, Greenfield & Sacks, P.C.

(57) ABSTRACT

A magnetic memory device includes a substrate having a first mold insulating film on a first region thereof, and a first structure on the substrate. The first structure includes a lower electrode, a magnetic tunnel junction (MTJ) structure on the lower electrode, and an upper electrode on the MTJ structure. A capping film is provided, which extends on the first mold insulating film and sidewalls of the first structure. A first etching stop layer is provided on the first structure and the capping film. A second mold insulating film is provided, which at least partially fills a space between the capping film and the first etching stop layer. A first metal structure is provided, which extends through a portion of the first etching stop layer and a portion of the second mold insulating film, and is electrically coupled to the MTJ structure.

20 Claims, 21 Drawing Sheets

(56) References Cited

U.S. PATENT DOCUMENTS

| | | | |
|---|---|---|---|
| 2003/0085408 A1* | 5/2003 | Yang | H01L 21/76829 |
| | | | 257/77 |
| 2014/0264668 A1* | 9/2014 | Lee | H10N 50/10 |
| | | | 257/421 |
| 2018/0166501 A1* | 6/2018 | Chuang | H10N 50/10 |
| 2018/0308899 A1* | 10/2018 | Chuang | H10N 50/01 |
| 2019/0393265 A1* | 12/2019 | Ying | H10B 61/22 |
| 2020/0006425 A1* | 1/2020 | Lin | H10N 50/01 |
| 2020/0098982 A1 | 3/2020 | Chuang et al. | |
| 2020/0119258 A1 | 4/2020 | Chuang et al. | |
| 2020/0127047 A1* | 4/2020 | Chen | H01L 23/5226 |
| 2020/0286952 A1* | 9/2020 | Chuang | H10N 50/01 |
| 2020/0350365 A1 | 11/2020 | Chen et al. | |
| 2020/0388648 A1* | 12/2020 | Kuo | H10B 61/22 |
| 2021/0066579 A1* | 3/2021 | Wang | G11C 11/161 |
| 2021/0375987 A1* | 12/2021 | Chuang | H10B 61/22 |
| 2021/0376228 A1* | 12/2021 | Peng | H10N 50/80 |

FOREIGN PATENT DOCUMENTS

| | | |
|---|---|---|
| KR | 20200001516 A | 1/2020 |
| KR | 20200047299 A | 5/2020 |

* cited by examiner

NONVOLATILE MEMORY DEVICES HAVING MAGNETIC TUNNEL JUNCTION MEMORY CELLS THEREIN

REFERENCE TO PRIORITY APPLICATION

This application claims priority from Korean Patent Application No. 10-2021-0015833, filed Feb. 4, 2021, the disclosure of which is hereby incorporated herein by reference.

BACKGROUND

1. Field of the Invention

The present disclosure relates to integrated circuit devices and, more particularly, to nonvolatile magnetic memory devices and methods of forming same.

2. Description of the Related Art

Nonvolatile memory devices that use resistance materials can include phase change memory devices (PRAM: Phase change Random Access Memory), resistance memory devices (RRAM: Resistive RAM), magnetic memory devices (MRAM: Magnetic RAM), and the like. A dynamic memory device (DRAM: Dynamic RAM) and a flash memory device store data based on charge(s), whereas a non-volatile memory device that uses resistance material stores data based on a resistance change (RRAM) of a phase change material such as a chalcogenide alloy, a resistance change (RRAM) of a variable resistance material, a resistance change (MRAM) of an MTJ (Magnetic Tunnel Junction) thin film depending on a magnetization state of a ferromagnetic material, and the like.

More specifically, typical MRAM (Magnetic Random Access Memory) devices receive more attention due to high read and write speeds, high durability, non-volatility, and low power consumption while operations are being performed. Further, an MRAM device may store information using reliable magnetic materials as an information-storage medium.

SUMMARY

Aspects of the present disclosure provide magnetic memory devices with enhanced reliability, and formed using more simplified fabrication processes.

Aspects of the present disclosure also provide electronic devices with enhanced reliability, and formed using more simplified fabrication processes.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment of the present disclosure, the magnetic memory device includes a substrate including a first region and a second region, a first mold insulating film on the substrate of the first region, a lower electrode contact inside the first mold insulating film, and a first structure, which is disposed on the lower electrode contact. The first structure includes a lower electrode, a magnetic tunnel junction (MTJ) structure, and an upper electrode. A capping film is provided, which is formed along an upper surface of the first mold insulating film and side walls of the first structure and surrounds the first structure. A first etching stop layer is provided on the first structure and the capping film. A second mold insulating film is provided, which at least partially fills a space between the first etching stop layer and the capping film. A first metal structure is provided, which is formed in the first etching stop layer and the second mold insulating film and is in contact with an upper surface of the first structure. A third mold insulating film is provided on the substrate of the second region. A first via contact is provided in the third mold insulating film, and a first metal wiring is provided, which is disposed in the third mold insulating film and disposed on the first via contact. In some embodiments of the disclosure, the third mold insulating film is different from the second mold insulating film, and a first height of the first metal structure is smaller than a second height of the first metal wiring.

According to the aforementioned and other embodiments of the present disclosure, the magnetic memory device can include a substrate including a first region and a second region, a first mold insulating film on the substrate of the first region and the second region, a lower electrode contact in the first mold insulating film of the first region, and a first structure, which is disposed on the lower electrode contact. The first structure includes a lower electrode, a magnetic tunnel junction (MTJ) structure, and an upper electrode. A capping film is provided, which is formed along an upper surface of the first mold insulating film of the first region and the second region and side walls of the first structure, and surrounds the first structure. A first etching stop layer is provided on the capping film. A second mold insulating film is provided, which at least partially fills a space between the first etching stop layer and the capping film. A first metal structure is provided, which is disposed in the first etching stop layer and the second mold insulating film of the first region, and is in contact with an upper surface of the first structure. A first via contact is provided, which is disposed in the first mold insulating film, the capping film and the second mold insulating film of the second region. A first metal wiring is provided, which is disposed in the second mold insulating film and the first etching stop layer of the second region, and is disposed on the first via contact. In some of these embodiments, a first height of the first metal structure is smaller than a second height of the first metal wiring, and the capping film and the first structure are in contact with each other.

According to the aforementioned and other embodiments of the present disclosure, an electronic device includes a logic region, and a memory region connected to the logic region. The memory region is embedded in the electronic device, and includes a cell region and a core peripheral region. The cell region includes a first substrate, a first mold insulating film on the first substrate, a lower electrode contact in the first mold insulating film, and a first structure, which is disposed on the lower electrode contact, and includes a lower electrode, a magnetic tunnel junction (MTJ) structure and an upper electrode. A capping film is provided, which is formed along an upper surface of the first mold insulating film and side walls of the first structure and surrounds the first structure. A first etching stop layer is provided on the first structure and the capping film. A second mold insulating film is provided, which at least partially fills a space between the first etching stop layer and the capping film. A first metal structure is provided, which is formed in the first etching stop layer and the second mold insulating film, and is in contact with an upper surface of the first structure. In addition, the core peripheral region includes a second substrate, a third mold insulating film on the second substrate, a first via contact in the third mold insulating film, and a first metal wiring, which is disposed in the third mold insulating film and on the first via contact. The third mold insulating film is different from the second mold insulating film, and a first height of the first metal structure is smaller than a second height of the first metal wiring.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION OF THE EMBODIMENTS

Hereinafter, embodiments according to the technical idea of the present disclosure will be described referring to the accompanying drawings.

Figure 1:
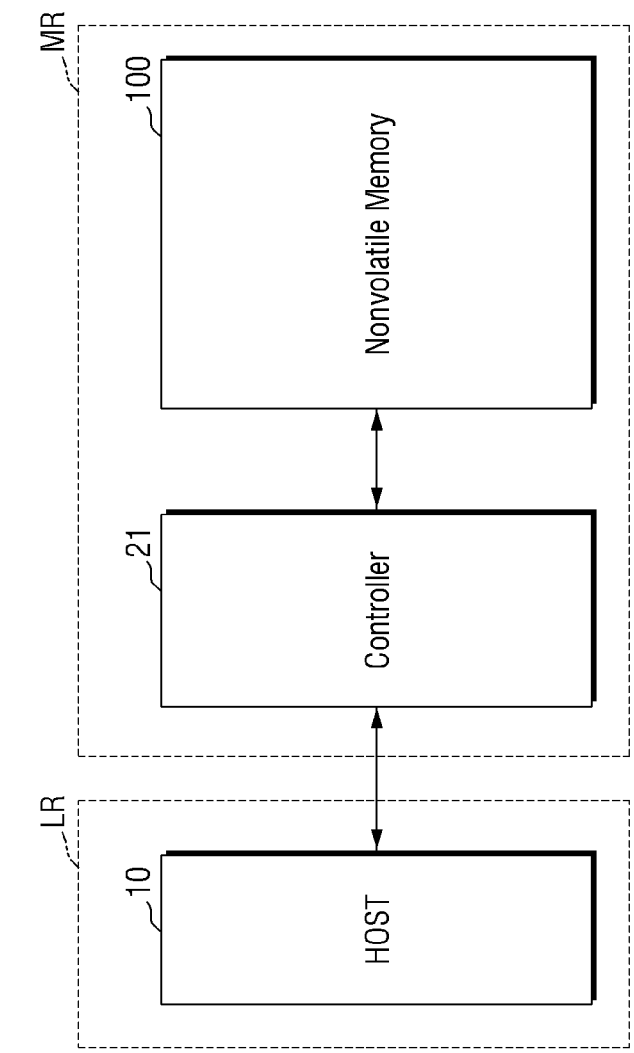
FIG. 1 is a block diagram for explaining an electronic device according to some embodiments.
Figure 2:
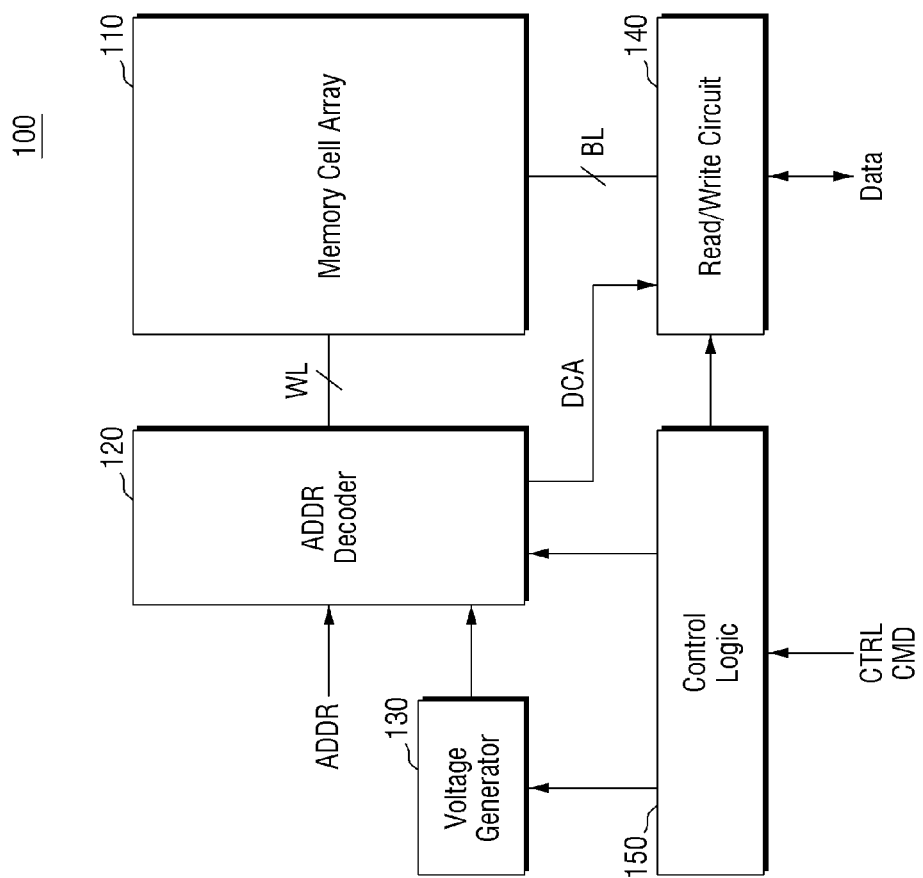
FIG. 2 is a block diagram for explaining the non-volatile memory of FIG. 1.

An electronic device 1 including a non-volatile memory 100 will be described below referring to FIGS. 1 and 2. FIG. 1 is a block diagram for explaining an electronic device according to some embodiments. FIG. 2 is a block diagram for explaining the non-volatile memory of FIG. 1. Referring to FIG. 1, the electronic device 1 may include a logic region LR and a memory region MR. Here, the logic region LR may include the host 10, and the memory region MR may include a controller 21 and a non-volatile memory 100.

In some embodiments, the logic region LR may be connected to the memory region MR through an interface. For example, the logic region LR may transmit a signal to the memory region MR to control the memory region MR. Further, for example, the logic region LR may receive the signal from the memory region MR and process the data included in the signal. For example, the host 10 may include a central processing unit (CPU), a controller or an application specific integrated circuit (ASIC). Further, for example, the host 10 may include a memory chip such as a DRAM (Dynamic Random Access Memory), a SRAM (Static RAM), a PRAM (Phase-change RAM), a MRAM (Magneto resistive RAM), a FeRAM (Ferroelectric RAM) and a RRAM (Resistive RAM).

The memory region MR may include the controller 21 and the non-volatile memory 100. For example, the non-volatile memory 100 may include a MRAM (magnetic random access memory), a PRAM (phase-change RAM), a RRAM (Resistive RAM), and the like. However, the embodiments according to the technical idea of the present disclosure are not limited thereto. The non-volatile memory 100 is not limited to the resistive memory, and may include various non-volatile memories such as an EPROM (Electrically Erasable and Programmable ROM), a flash memory, and a FRAM (Ferroelectric RAM).

The controller 21 and the non-volatile memory 100 may be connected through an interface. The controller 21 may access the non-volatile memory 100. For example, the controller 21 may control the read, write, and erase operations of the non-volatile memory 100. The controller 21 may act as an interface between the host 10 and the non-volatile memory 100. The controller 21 may drive firmware for controlling the non-volatile memory 100.

The interface between the host 10 and the controller 21 may include, for example, various communication standards, such as a USB (Universal Serial Bus), a MMC (multimedia card), a PCI (peripheral component interconnection), a PCI-E (PCI-express), an ATA (Advanced Technology Attachment), a Serial-ATA, a Parallel-ATA, a SCSI (small computer small interface), an ESDI (enhanced small disk interface), an IDE (Integrated Drive Electronics), and Firewire.

The memory region MR may include an embedded MRAM which is built in the electronic device 1. Here, the non-volatile memory 100 of the memory region MR may be built in the electronic device 1. The non-volatile memory 100 may also be built in the logic region LR. However, the embodiments of the present disclosure are not limited thereto.

Referring to FIG. 2, the non-volatile memory 100 may include a memory cell array 110, an address decoder 120, a voltage generator 130, a read/write circuit 140, a control logic 150 and the like. The memory cell array 110 may be connected to the address decoder 120 through word lines WL. The memory cell array 110 may be connected to the read/write circuit 140 through bit lines BL. The memory cell array 110 may include a plurality of memory cells. For example, memory cells arranged in a row direction may be connected to the word line WL. For example, memory cells arranged in a column direction may be connected to the bit line BL. Here, the word line WL may include a read word line or a write word line, and the bit line BL may include a bit line or a sensing line.

The address decoder 120 may be connected to the memory cell array 110 through the word line WL. The address decoder 120 may operate in response to the control of the control logic 150. The address decoder 120 may receive an address ADDR from the controller 21. The address decoder 120 may receive the voltage required for the operation such as program and read from the voltage generator 130. The address decoder 120 may decode the row address in the received address ADDR. The address decoder 120 may select the word line WL, using the decoded row address. The decoded column address DCA may be provided to the read/write circuit 140. For example, the address decoder 120 may include a row decoder, a column decoder, an address buffer, and the like.

The voltage generator 130 may generate the voltage required for access operation under the control of the control logic 150. For example, the voltage generator 130 may generate a program voltage and a program verification voltage required to perform the program operation. For example, the voltage generator 130 may generate read voltages required to perform the read operation, and may generate an erase voltage and an erase verification voltage required to perform the erase operation, and the like. Further, the voltage generator 130 may provide the address decoder 120 with the voltage required to perform each operation.

The read/write circuit 140 may be connected to the memory cell array 110 through the bit line BL. The read/write circuit 140 may send and receive data (Data) to and from the controller 21. The read/write circuit 140 may operate in response to the control of the control logic 150. The read/write circuit 140 may receive the decoded column address DCA from the address decoder 120. The read/write circuit 140 may select the bit line BL, using the decoded column address DCA.

For example, the read/write circuit 140 may program the received data Data into the memory cell array 110. The read/write circuit 140 may read the data from the memory cell array 110, and provide the read data to outside (for example, the controller 21). For example, the read/write circuit 140 may include configurations such as a detection amplifier, a write driver, a column selection circuit, and a page buffer.

The control logic 150 may be connected to the address decoder 120, the voltage generator 130 and the read/write circuit 140. The control logic 150 may control the operation of the non-volatile memory 100. The control logic 150 may operate in response to a control signal CRTL and a command CMD (e.g., a write command, a read command, and the like) provided from the controller 21.

Figure 3:
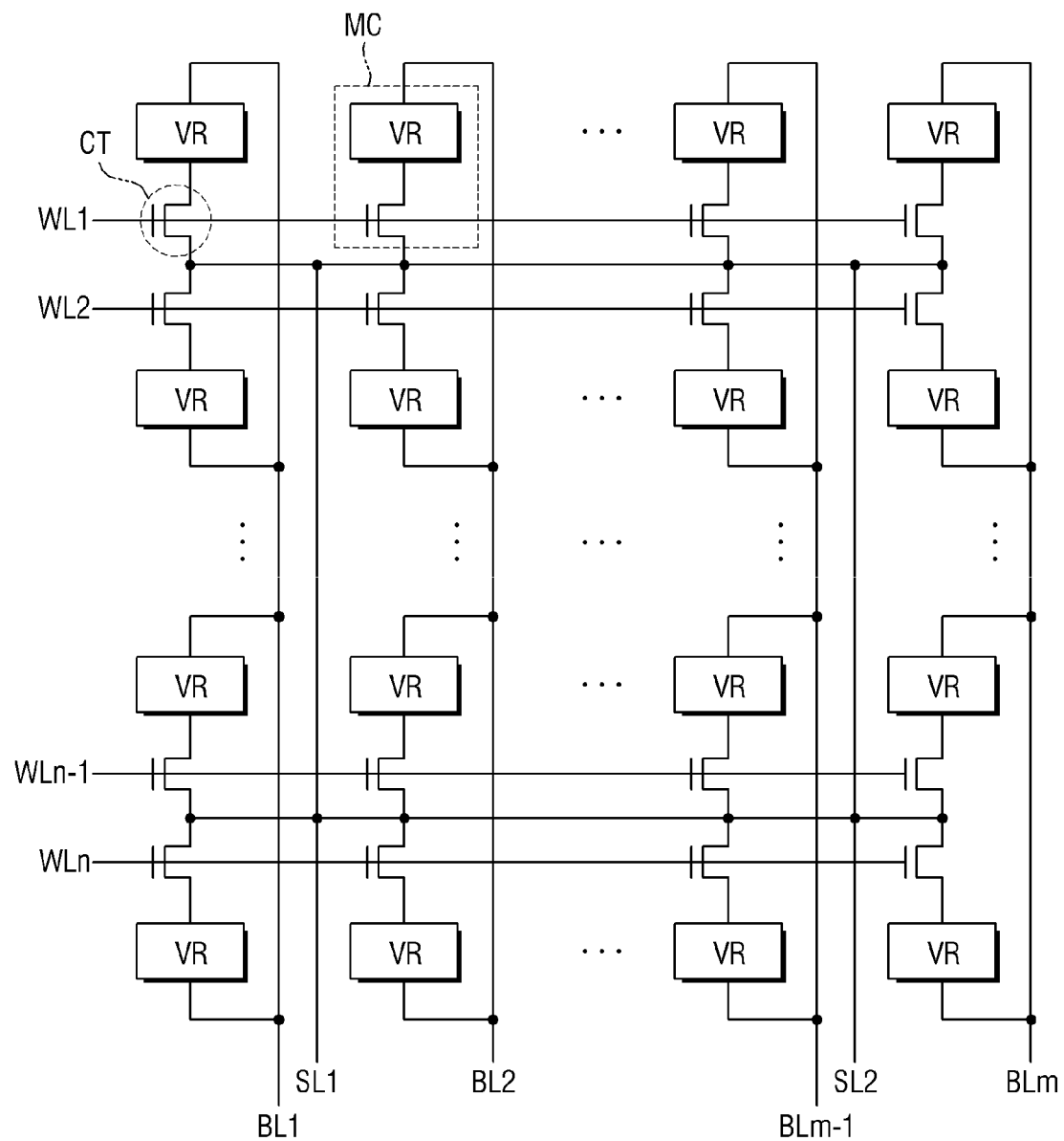
FIG. 3 is a diagram showing a memory cell array according to some embodiments.
Figure 4:
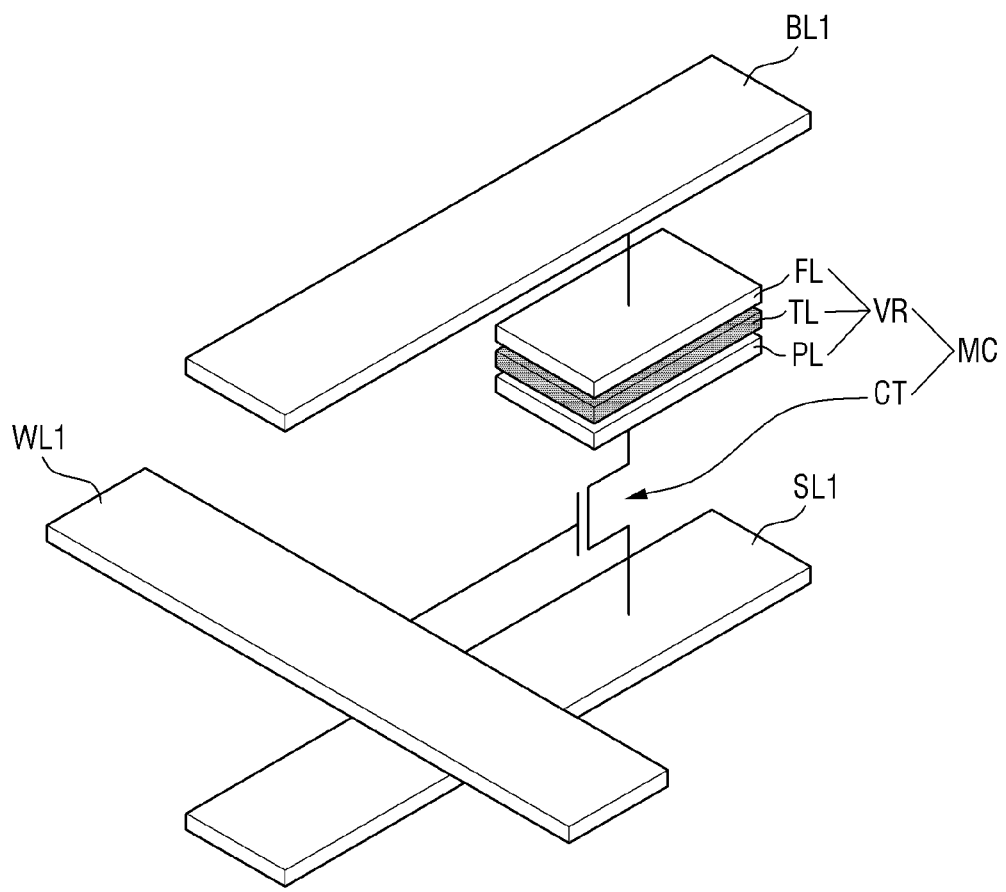
FIG. 4 is an exemplary diagram showing the memory cells of the memory cell array of FIG. 3.
Figure 5:
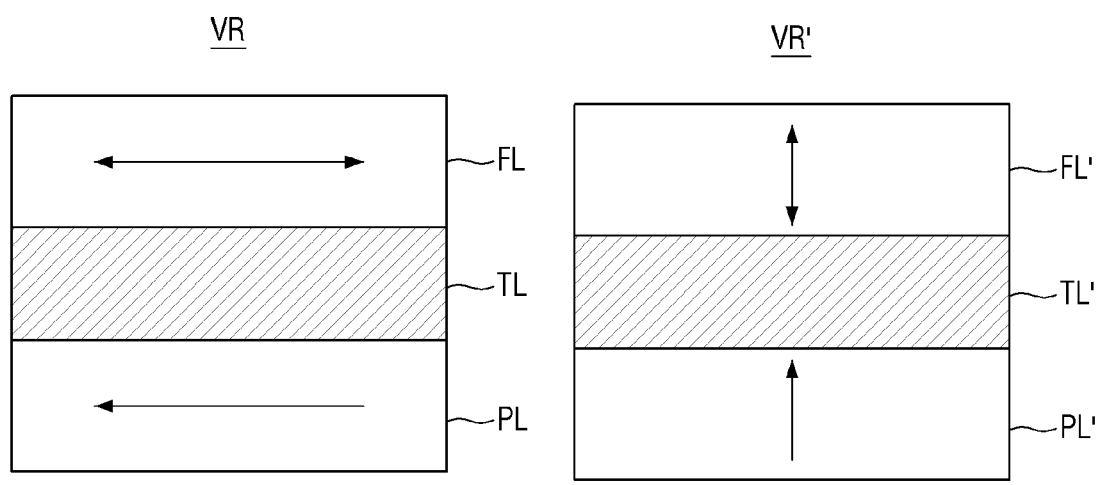
FIG. 5 is an exemplary diagram showing a variable resistance element according to some embodiments.

FIG. 3 is a diagram showing a memory cell array according to some embodiments. FIG. 4 is an exemplary diagram showing the memory cells of the memory cell array of FIG. 3. FIG. 5 is an exemplary diagram showing a variable resistance element according to some embodiments. Referring to FIGS. 3 and 4, the memory cell array 110 may include a plurality of memory cells MC. The memory cells MC may be placed along the row direction and the column direction. The memory cell MC may include, for example, a variable resistance element VR and a cell transistor CT. Here, the memory region MR including the memory cell array 110 including the memory cell MC may correspond to MRAM.

A gate of the cell transistor CT may be connected to the word lines WL1 to WLn. The gates of the cell transistors CT arranged in the row direction may be connected in common to one word line (for example, the first word line WL1). The gates of cell transistor CT of other rows may be connected to other word lines.

One end of the cell transistor CT may be connected to one end of the variable resistance element VR. The other end of the cell transistor CT may be connected to the source line (e.g., the source line SL1 and the source line SL2). The other ends of a pair of adjacent cell transistors CT may be connected in common with one source line (e.g., the source line SL1).

One end and the other end of the variable resistance element VR may be connected to the bit lines BL1 to BLm. The other ends of the variable resistance elements VR arranged in the column direction may be connected in common to one bit line (for example, the first bit line BL1).

The variable resistance element VR may have one of a low resistance state and a high resistance state depending on the bias condition. By adjusting the state of the variable resistance element VR to one of the low resistance state and the high resistance state, data may be stored in the variable resistance element VR.

Referring to FIG. 4, the variable resistance element VR may include a free layer FL, a pinned layer PL, and a tunnel layer TL, in some embodiments of the invention. For example, the free layer FL, the pinned layer PL and the tunnel layer TL may be placed between the first bit line BL1 and the cell transistor CT. The tunnel layer TL may be placed between the free layer FL and the pinned layer PL.

Referring to FIG. 5, a magnetization direction of the pinned layer PL may be fixed. A magnetization direction of the free layer FL may be the same as or opposite to the magnetization direction of the pinned layer PL, depending on the bias conditions. When the magnetization direction of the free layer FL and the magnetization direction of the pinned layer PL are parallel (when they are in the same direction), the resistance value of the variable resistance element VR may decrease. When the magnetization direction of the free layer FL and the magnetization direction of the pinned layer PL are anti-parallel, the resistance value of the variable resistance element VR may increase.

For example, when a current flows from the free layer FL to the pinned layer PL, electrons may move from the pinned layer PL to the free layer FL. The electrons flowing through the pinned layer PL may rotate along the magnetization direction of the pinned layer PL. The free layer FL may be magnetized by electrons that rotate along the magnetization direction of the pinned layer PL. For example, the free layer FL may be magnetized in the same direction as the pinned layer PL.

For example, when a current flows from the pinned layer PL to the free layer FL, electrons may move from the free layer FL to the pinned layer PL. Some of the electrons injected into the pinned layer PL may be reflected from the pinned layer PL to the free layer FL. The reflected electrons may rotate by the magnetization direction of the pinned layer PL. The rotation direction of the reflected electrons may be opposite to the magnetization direction of the pinned layer PL. The free layer FL may be magnetized by electrons having rotation. That is, the free layer FL may be magnetized in the direction opposite to the magnetization direction of the pinned layer PL. A variable resistance element VR', as shown by FIG. 5, may include a pinned layer PL', a free layer FL' and a tunnel layer TL'. The pinned layer PL' and the free layer FL' of the variable resistance element VR' may have a perpendicular magnetization direction, unlike the variable resistance element VR.

Figure 6:
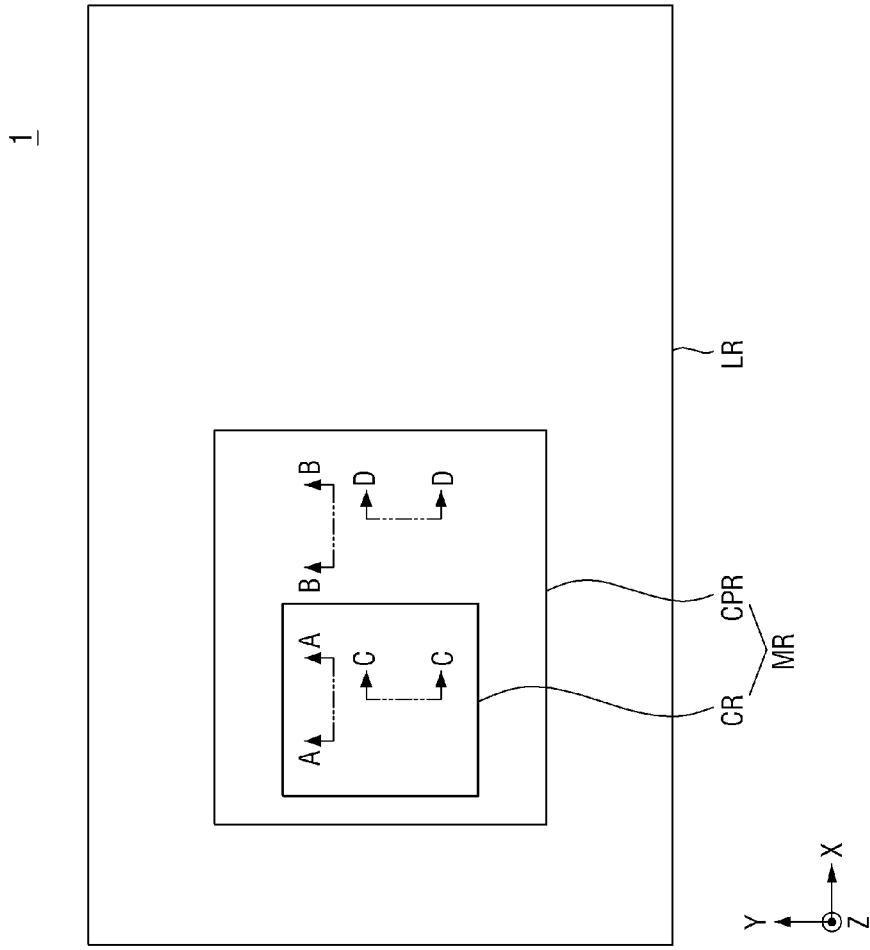
FIG. 6 is a top view of the electronic device according to some embodiments.
Figure 7:
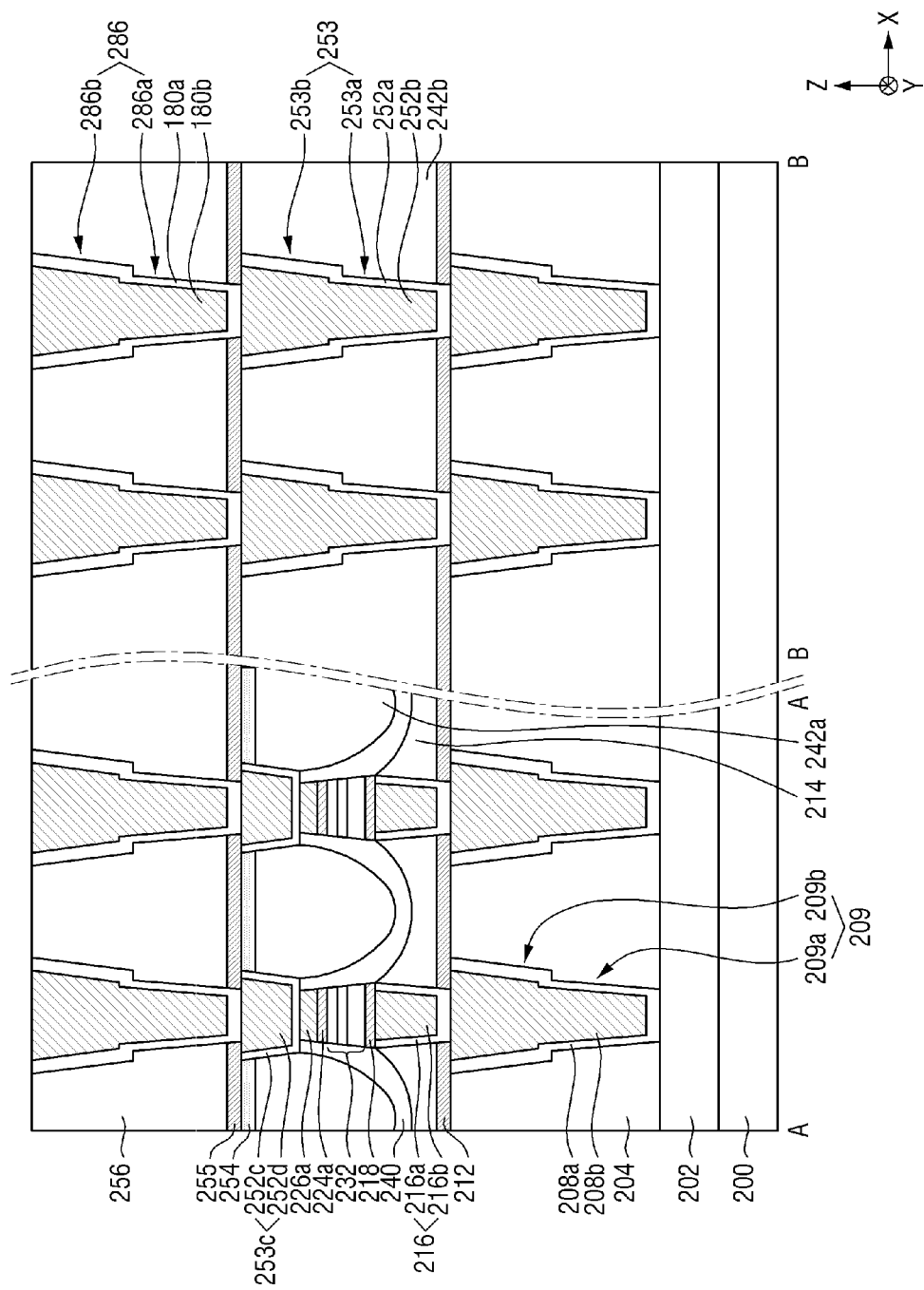
FIG. 7 is a cross-sectional view of the electronic device taken along lines A-A and B-B of FIG. 6.
Figure 8:
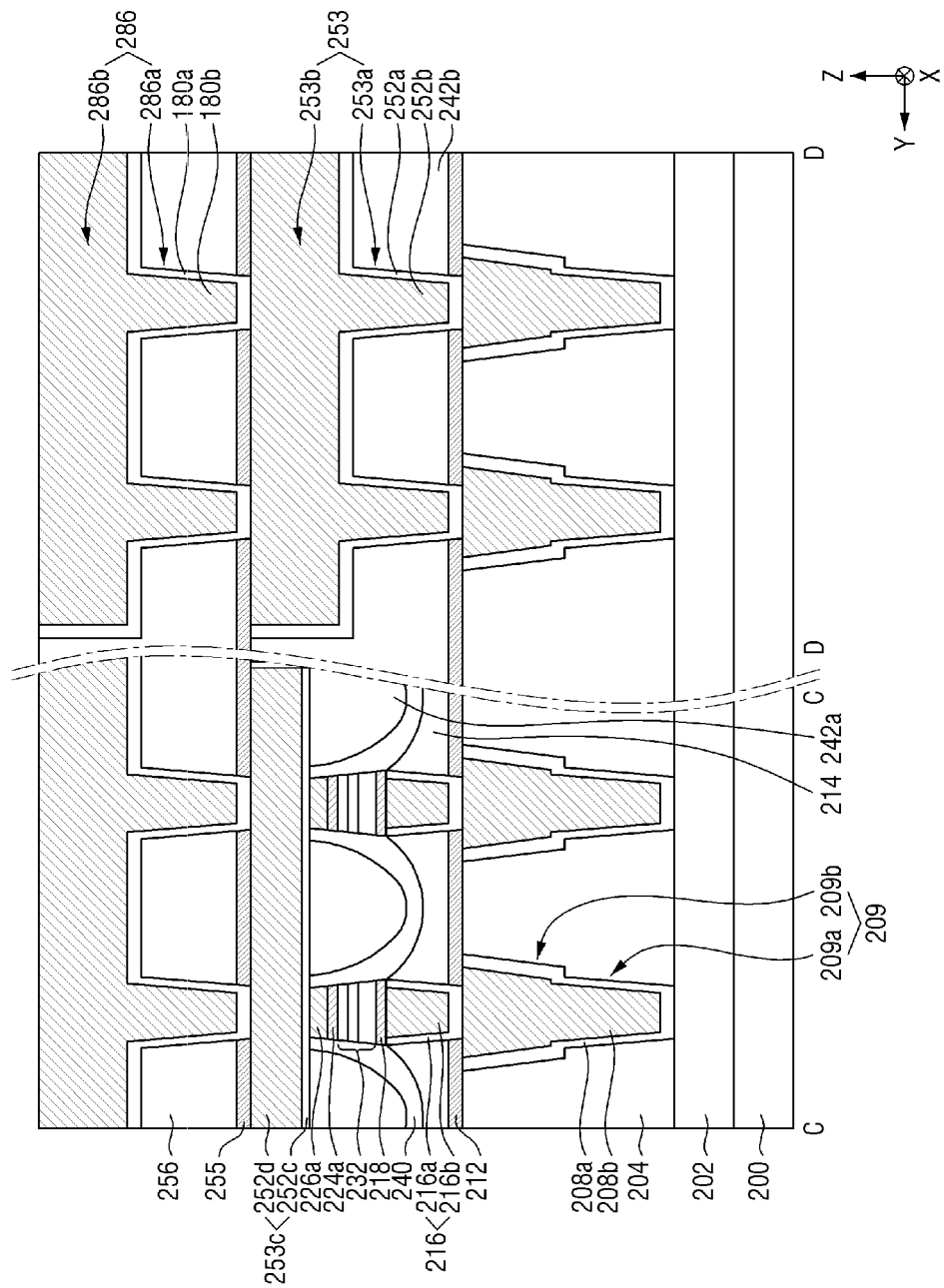
FIG. 8 is a cross-sectional view of the electronic device taken along lines C-C and D-D of FIG. 6.

Hereinafter, the electronic device 1 including the memory region MR and the logic region LR will be explained referring to FIGS. 6 to 10. FIG. 6 is a top view of the electronic device according to some embodiments. FIG. 7 is a cross-sectional view of the electronic device taken along A-A and B-B of FIG. 6. FIG. 8 is a cross-sectional view of the electronic device taken along C-C and D-D of FIG. 6.

Referring to FIG. 6, the electronic device 1 may include a memory region MR and a logic region LR. As explained referring to FIGS. 1 to 5, the memory region MR may include the controller 21 and the non-volatile memory 100, and the logic region LR may include the host 10. Here, the memory region MR may be built in the electronic device 1, and in this case, the memory region MR may be an embedded MRAM (eMRAM).

The memory region MR and the logic region LR may be built into the electronic device 1. Referring to FIG. 6, although the memory region MR is surrounded by the logic region LR, the embodiments of the present disclosure are not limited thereto. The memory region MR may include a cell region CR and a core peripheral region CPR. Although the cell region CR is surrounded by the core peripheral region CPR, the embodiments of the present disclosure are not limited thereto. The cell region CR may correspond to the memory cell array 110 of FIG. 2, and the core peripheral region CPR may correspond to the address decoder 120, the voltage generator 130, the read/write circuit 140, the control logic 150 and the like. That is, the cell region CR may include a memory cell array 110 including the memory cell MC, and the core peripheral region CPR may include a circuit region around the memory cell array 110. Here, although the drawings show that the core peripheral region CPR does not overlap the cell region CR, the embodiments of the present disclosure are not limited thereto. For example, the core peripheral region CPR may overlap the cell region CR.

Referring to FIGS. 7 and 8, the electronic device 1 may include a substrate 200, a lower insulating film 202 and the like. For example, the electronic device 1 may include a substrate 200 that includes the cell region CR and the core peripheral region CPR. The substrate 200 may extend in a planar manner along the first direction X and the second direction Y. The substrate 200 may include silicon, germanium, silicon-germanium, or group III-V compounds such as GaP, GaAs, and GaSb. In some embodiments, the substrate 200 may be a silicon-on-insulator (SOI) substrate or a germanium-on-insulator (GOI) substrate.

A circuit pattern formed on the substrate 200 of the cell region CR may include a selection element (e.g., a cell transistor CT) that constitutes the memory cell MC, and a circuit pattern formed in the substrate 200 of the core peripheral region CPR may include logic transistors corresponding to a logic circuit or a peripheral circuit. The lower insulating film 202 may cover the substrate 200. In detail, the lower insulating film 202 may cover the circuit pattern on the substrate 200. The lower insulating film 202 may extend in the first direction X and the second direction Y to cover the substrate 200 corresponding to the cell region CR and the core peripheral region CPR. The first lower wirings may be formed inside the lower insulating film 202.

The lower insulating film 202 may include a plurality of interlayer insulating films. The first lower wirings may be formed inside a plurality of interlayer insulating films. The lower insulating film 202 may include a silicon oxide. The first lower wiring formed in the lower insulating film 202 may include a contact plug, a conductive pattern, and the like. Further, the first lower wiring formed in the lower insulating film 202 may include polysilicon, metal, or the like. Although the thickness of the substrate 200 and the lower insulating film 202 in the third direction Z is shown as being smaller than the thickness of other layers, the embodiments of the present disclosure are not limited thereto. That is, the substrate 200 and the lower insulating film 202 may include a plurality of layers, and may have a thickness greater than those of the other layers.

In some embodiments, the electronic device 1 may include an upper insulating film 204, a second lower wiring 209, and the like. The upper insulating film 204 may be formed on the lower insulating film 202 corresponding to the cell region CR and the core peripheral region CPR. The second lower wiring 209 may be placed in the upper insulating film 204. The second lower wiring 209 may include a contact plug 209a, and a lower conductive pattern 209b on the contact plug 209a. An upper surface of the upper insulating film 204 and an upper surface of the second lower wiring 209 may be located substantially on the same plane.

The second lower wiring 209 may include a first barrier pattern 208a and a first conductive pattern 208b. The first barrier pattern 208a may be formed to surround the side surfaces and the bottom surface of the first conductive pattern 208b. The first barrier pattern 208a may include, for example, metal nitrides such as tungsten nitrides, tantalum nitrides, and titanium nitrides, and/or metals such as tantalum and titanium. The first conductive pattern 208b may include, for example, copper.

The contact plug 209a may have a cylindrical shape. That is, the contact plug 209a may have widths in the first direction X and the second direction Y. The lower conductive pattern 209b may be formed on the contact plug 209a. The lower conductive pattern 209b may have a cylindrical shape. The width of the lower conductive pattern 209b in the first direction X and the second direction Y may be greater than the width of the contact plug 209a in the first direction X and the second direction Y.

The second lower wiring 209 including the contact plug 209a and the lower conductive pattern 209b may be formed in both the cell region CR and the core peripheral region CPR. That is, the second lower wiring 209 may be formed in the upper insulating film 204 corresponding to the cell region CR and the core peripheral region CPR, and may be connected to the lower insulating film 202 and the substrate 200.

Figure 9:
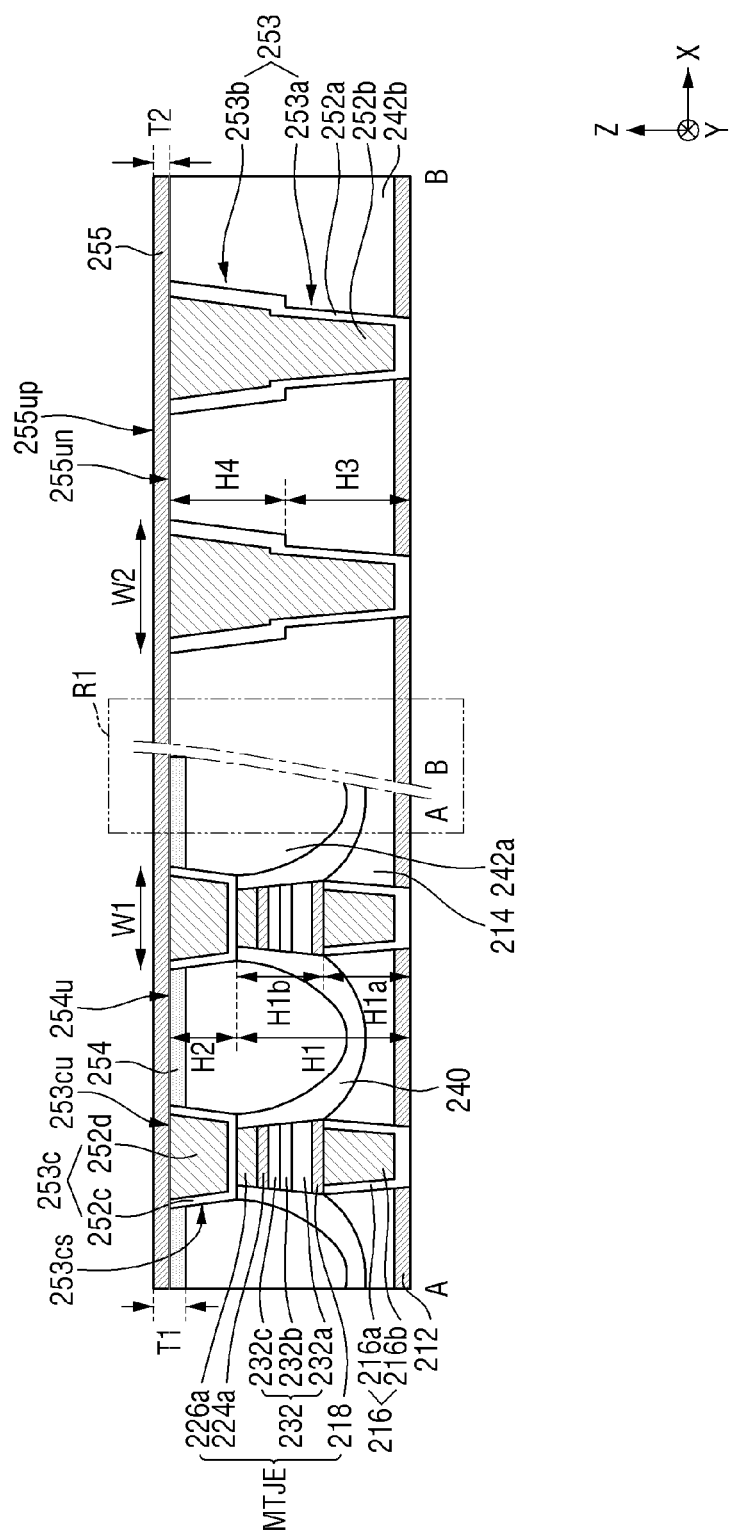
FIG. 9 is a cross-sectional view of the electronic device according to some embodiments.
Figure 10:
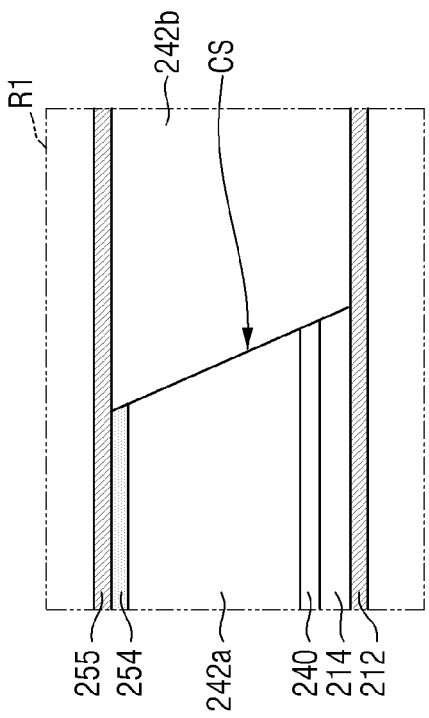
FIG. 10 is an enlarged view of a region R1 of FIG. 9.

FIG. 9 is a cross-sectional view of the electronic device according to some embodiments. FIG. 10 is an enlarged view of a region R1 of FIG. 9. Referring to FIG. 9, the electronic device 1 may include a first etching stop layer 212, a first mold insulating film 214, a lower electrode contact 216, and the like. Here, the first mold insulating film 214 and the lower electrode contact 216 may be placed only in the cell region CR, and may not be placed in the core peripheral region CPR.

The first etching stop layer 212 may include silicon nitride, silicon carbonitride and the like. The first etching stop layer 212 may be formed on the upper insulating film 204 corresponding to the cell region CR and the core peripheral region CPR. Furthermore, the first etching stop layer 212 may cover the second lower wiring 209 corresponding to the cell region CR and the core peripheral region CPR. The first mold insulating film 214 may include an oxide such as a silicon oxide, however, other electrically insulating materials may also be used. The first mold insulating film 214 may be formed on the first etching stop layer 212 corresponding to the cell region CR, but may not be formed on the first etching stop layer 212 corresponding to the core peripheral region CPR.

The lower electrode contact 216 may be formed to penetrate the first etching stop layer 212 and the first mold insulating film 214. The lower electrode contact 216 may be located in the cell region CR, but may not be located in the core peripheral region CPR. The lower electrode contact 216 may be surrounded by the first etching stop layer 212 and the first mold insulating film 214. The lower electrode contact 216 may include a barrier pattern 216a and a conductive pattern 216b. The barrier pattern 216a may include metal nitrides such as tungsten nitride, tantalum nitride and titanium nitride and/or metals such as tantalum and titanium, and the conductive pattern 216b may include a conductive material such as copper.

The upper surface of the first mold insulating film 214 may have a recessed shape. That is, the thickness of the first mold insulating film 214 adjacent to the lower electrode contact 216 may be greater than the thickness of the first mold insulating film 214 far away from the lower electrode contact 216.

In some embodiments, the electronic device 1 may include an MTJ element MTJE. The MTJ element MTJE may be placed on the upper surface of the lower electrode contact 216. For example, the MTJ element MTJE may include a lower electrode 218, an MTJ structure 232, an intermediate electrode film 224a, an upper electrode 226a and the like. Here, the lower electrode 218, the MTJ structure 232, the intermediate electrode film 224a, and the upper electrode 226a may be sequentially stacked from the upper surface of the lower electrode contact 216. The MTJ element MTJE may have an inclined side wall. That is, the width of the upper surface of the MTJ element MTJE may be wider than the width of the lower surface. Further, the width of the lower surface of the MTJ element MTJE may be the same as the width of the upper surface of the lower electrode contact 216. The lower electrode 218 may include a metal such as titanium and tantalum or a metal nitride such as titanium nitride and tantalum nitride. And, the MTJ structure 232 may include a first magnetic pattern 232a, a tunnel barrier pattern 232b, a second magnetic pattern 232c, and the like.

The first magnetic pattern 232a may be a pinned layer with a pinned magnetization direction. For example, the first magnetic pattern 232a may include a pinned pattern, a lower ferromagnetic pattern, an antiferromagnetic coupling spacer pattern, an upper ferromagnetic pattern, and the like. For example, the first magnetic pattern 232a may include ferromanganese (FeMn), manganese iridium (IrMn), manganese platinum (PtMn), manganese oxide (MnO), manganese sulfide (MnS), tellurium manganese (MnTe), manganese fluoride (MnF2), iron fluoride (FeF2), iron chloride (FeCl2), iron oxide (FeO), cobalt chloride (CoCl2), cobalt oxide (CoO), nickel chloride (NiCl2), nickel oxide (NiO), chromium (Cr) and the like. The upper and lower ferromagnetic patterns corresponding to the first magnetic pattern 232a may include, for example, a ferromagnetic material including at least one of iron (Fe), nickel (Ni) and cobalt (Co). An antiferromagnetic coupling spacer pattern corresponding to the first magnetic pattern 232a may include, for example, at least one of ruthenium (Ru), iridium (Ir) or rhodium (Rh).

The second magnetic pattern 232c may be a free layer having a variable magnetization direction. For example, the second magnetic pattern 232c may include a ferromagnetic material such as iron (Fe), cobalt (Co), nickel (Ni), chromium (Cr), and platinum (Pt). The second magnetic pattern 232c may also further include boron (B) or silicon (Si). The second magnetic pattern 232c may also include composite materials such as CoFe, NiFe, FeCr, CoFeNi, PtCr, CoCrPt, CoFeB, NiFeSiB, and CoFeSiB.

The tunnel barrier pattern 232b may be placed between the first and second magnetic patterns 232a and 232c. Accordingly, the first and second magnetic patterns 232a and 232c may not be in direct contact with each other. The tunnel barrier pattern 132b may include metal oxides having insulating properties. For example, the tunnel barrier pattern 132b may include magnesium oxide (MgOx) or aluminum oxide (AlOx).

An intermediate electrode 224a may include at least one of a metal such as titanium and tantalum or a metal nitride such as titanium nitride and tantalum nitride. In addition, the upper electrode 226a may include tungsten, copper, platinum, nickel, silver, gold and the like.

In some embodiments, the electronic device 1 may include a capping film 240, a second mold insulating film 242a, an etching stop layer 254 and the like. The capping film 240 may be formed on the surface of the first mold insulating film 214 and the MTJ element MTJE of the cell region CR. That is, the capping film 240 may be conformally formed on the surfaces of the first mold insulating film 214 and the MTJ element MTJE of the cell region CR. The capping film 240 may have a substantially uniform thickness. The capping film 240 may come into contact with the side walls of the MTJ element MTJE to protect the MTJ element MTJE. The capping film 240 may include silicon nitride or silicon oxynitride. An upper surface of the capping film 240 may have a recessed shape, like the upper surface of the first mold insulating film 214.

The second mold insulating film 242a may be formed on the capping film 240 corresponding to the cell region CR. The second mold insulating film 242a may at least partially fill the space between the MTJ elements MTJE. The second mold insulating film 242a may include an oxide such as a silicon oxide. The upper surface of the second mold insulating film 242a may be higher than the upper surface of the MTJ element MTJE. That is, the second mold insulating film 242a may completely cover the MTJ element MTJE. However, the second mold insulating film 242a may not be formed in the core peripheral region CPR.

The etching stop layer 254 may be formed on the second mold insulating film 242a corresponding to the cell region CR. The etching stop layer 254 may include silicon nitride, silicon carbonitride and the like. However, the etching stop layer 254 may not be formed in the core peripheral region CPR.

In some embodiments, the electronic device 1 may include a first metal structure 253c. The first metal structure 253c may be placed in the second mold insulating film 242a and the etching stop layer 254 corresponding to the cell region CR. The first metal structure 253c may include a third barrier pattern 252c and a third conductive pattern 252d. The third barrier pattern 252c may be conformally formed along the trench formed in the second mold insulating film 242a and the etching stop layer 254. That is, the third barrier pattern 252c may be in contact with the second mold insulating film 242a, the etching stop layer 254, the MTJ element MTJE, and the capping film 240. Further, the third conductive pattern 252d may fill the trench formed by the third barrier pattern 252c.

The first metal structure 253c may include a first metal structure upper surface 253cu and first metal structure side surfaces 253cs. Here, the first metal structure upper surface 253 may be in contact with an etching stop layer lower surface 255un. Further, the first metal structure side surfaces 253cu may be in contact with the etching stop layer 254 and the second mold insulating film 242a.

Referring to FIG. 8, the first metal structure 253c may extend long in the second direction Y. That is, although the first metal structure 253c may have a line shape, the embodiments of the present disclosure are not limited thereto.

Referring to FIG. 9 again, the electronic device 1 may include a third mold insulating film 242b, a first metal wiring structure 253 and the like. The third mold insulating film 242b may be formed on the first etching stop layer 212 corresponding to the core peripheral region CPR. That is, the third mold insulating film 242b may not be formed in the cell region CR. The third mold insulating film 242b may include an oxide. For example, the third mold insulating film 242b may include an oxide such as ULK (ultra low-k). However, the second mold insulating film 242a may include HDP-CVD (high density plasma-chemical vapor deposition) oxides. That is, the second and third mold insulating films 242a and 242b may include different materials from each other.

The first metal wiring structure 253 may be formed in the first etching stop layer 212 and the third mold insulating film 242b corresponding to the core peripheral region CPR. That is, the first metal wiring structure 253 may be formed in a via that penetrates the first etching stop layer 212 and the third mold insulating film 242b. The first metal wiring structure 253 may include a first via contact 253a and a first metal wiring 253b. The first via contact 253a may be a contact formed in the first etching stop layer 212 and the third mold insulating film 242b. The first metal wiring 253b may be a line formed in the third mold insulating film 242b. For example, the first metal wiring 253b may extend long along the second direction Y. Further, the width of the first metal wiring 253b in the first direction X may be greater than the width of the first via contact 253a in the first direction X. An upper surface of the first metal wiring 253b may be exposed on an upper surface of the third mold insulating film 242b.

The first metal wiring structure 253 may include a second barrier pattern 252a and a second conductive pattern 252b. The second barrier pattern 252a may be conformally formed along the side surfaces and bottom surfaces of the vias formed in the first etching stop layer 212 and the third mold insulating film 242b. The second conductive pattern 252b may fill a trench formed by the second barrier pattern 252a.

Referring to FIGS. 7 and 8 again, the electronic device 1 may include an etching stop layer 255, a fourth mold insulating film 256, and a second metal wiring structure 286. This etching stop layer 255 may be formed in both the cell region CR and the core peripheral region CPR. That is, the etching stop layer 255 may be formed on the etching stop layer 254 of the cell region CR and the third mold insulating film 242b of the core peripheral region CPR. The etching stop layer lower surface 255un of the etching stop layer 255 may be in contact with the etching stop layer upper surface 254u of the etching stop layer 254. Further, the etching stop layer upper surface 255up may be exposed. The fourth mold insulating film 256 may be formed on the etching stop layer 255. The second metal wiring structure 286 may be formed in the etching stop layer 255 and the fourth mold insulating film 256. The second metal wiring structure 286 may be connected to the first metal structure 253c in the cell region CR, and the second metal wiring structure 286 may be connected to the first metal wiring structure 253 in the core peripheral region CPR.

The second metal wiring structure 286 may include a second via contact 286a and a second metal wiring 286b. The second via contact 286a may be a contact formed inside the etching stop layer 255 and the fourth mold insulating film 256. The second metal wiring 286b may be a line formed inside the fourth mold insulating film 256. For example, the second metal wiring 286b may extend long along the second direction Y. Further, the width of the second metal wiring 286b in the first direction X may be greater than the width of the second via contact 286a in the first direction X. Here, the width of the second via contact 286a in the first direction X may be smaller than the width of the first metal structure 253c in the first direction X.

The second metal wiring structure 286 may include a fourth barrier pattern 180a and a fourth conductive pattern 180b. The fourth barrier pattern 180a may be conformally formed along the side surfaces and bottom surface of the via formed inside the etching stop layer 255 and the fourth mold insulating film 256. The fourth conductive pattern 180b may fill the trench formed by the fourth barrier pattern 180a.

Referring to FIG. 10, the cell region CR and the core peripheral region CPR may be divided. That is, the cell region CR and the core peripheral region CPR may be divided by the contact surface CS in the R1 region. Here, the cell region CR may include a first mold insulating film 214, a capping film 240, a second mold insulating film 242a, and an etching stop layer 254, which are sequentially stacked. The core peripheral region CPR may include a third mold insulating film 242b. The first mold insulating film 214, the capping film 240, the second mold insulating film 242a and the etching stop layer 254 may be in contact with the third mold insulating film 242b at the contact surface CS.

Referring to FIG. 9 again, a height of the lower electrode contact 216 in the third direction Z, i.e., in the vertical direction, may be a first height H1a, a height of the MTJ element MTJE in the third direction Z may be a first height H1b, and a height of the lower electrode contact 216 and the MTJ element MTJE in the third direction Z may be a first height H1. A height of the first metal structure 253c in the third direction Z may be a second height H2. A height of the first via contact 253a in the third direction Z may be a third height H3, and a height of the first metal wiring 253b in the third direction Z may be a fourth height H4. Here, a height of each portion may be a distance from the bottom surface to the upper surface in the third direction Z.

The first height H1 may be greater than the third height H3, and the second height H2 being smaller than the fourth height H4. That is, the second height H2 of the first metal structure 253c may be smaller than the fourth height H4 of the first metal wiring 253b. The first metal structure 253c and the first metal wiring 253b may be formed by the same process. The second metal wiring structure 286 formed on the top of the first metal structure 253c and the first metal wiring 253b may correspond to a bit line. When the first metal structure 253c and the first metal wiring 253b are formed by the same process, the difficulty of the bit line process may be improved, and reliability of the electronic device 1 including the embedded non-volatile memory 100 may be further improved.

A width of the first metal structure 253c in the first direction X may be a first width W1, and a width of the first metal wiring structure 253 in the first direction X may be a second width W2. Here, although the second width W2 may be greater than the first width W1, the embodiment of the present disclosure is not limited thereto. The thickness of the etching stop layer 254 and the etching stop layer 255 in the cell region CR may be a first thickness T1, and the thickness of the etching stop layer 255 in the core peripheral region CPR may be a second thickness T2. Here, the first thickness T1 may be greater than the second thickness T2.

Hereinafter, a method for fabricating the electronic device 1 according to some embodiments will be explained referring to FIGS. 11 to 17. In particular, FIGS. 11 to 17 are diagrams of the method for fabricating the electronic device according to some embodiments. For convenience of explanation, repeated parts of contents explained using FIGS. 1 to 10 will be briefly explained or omitted.

Figure 11:
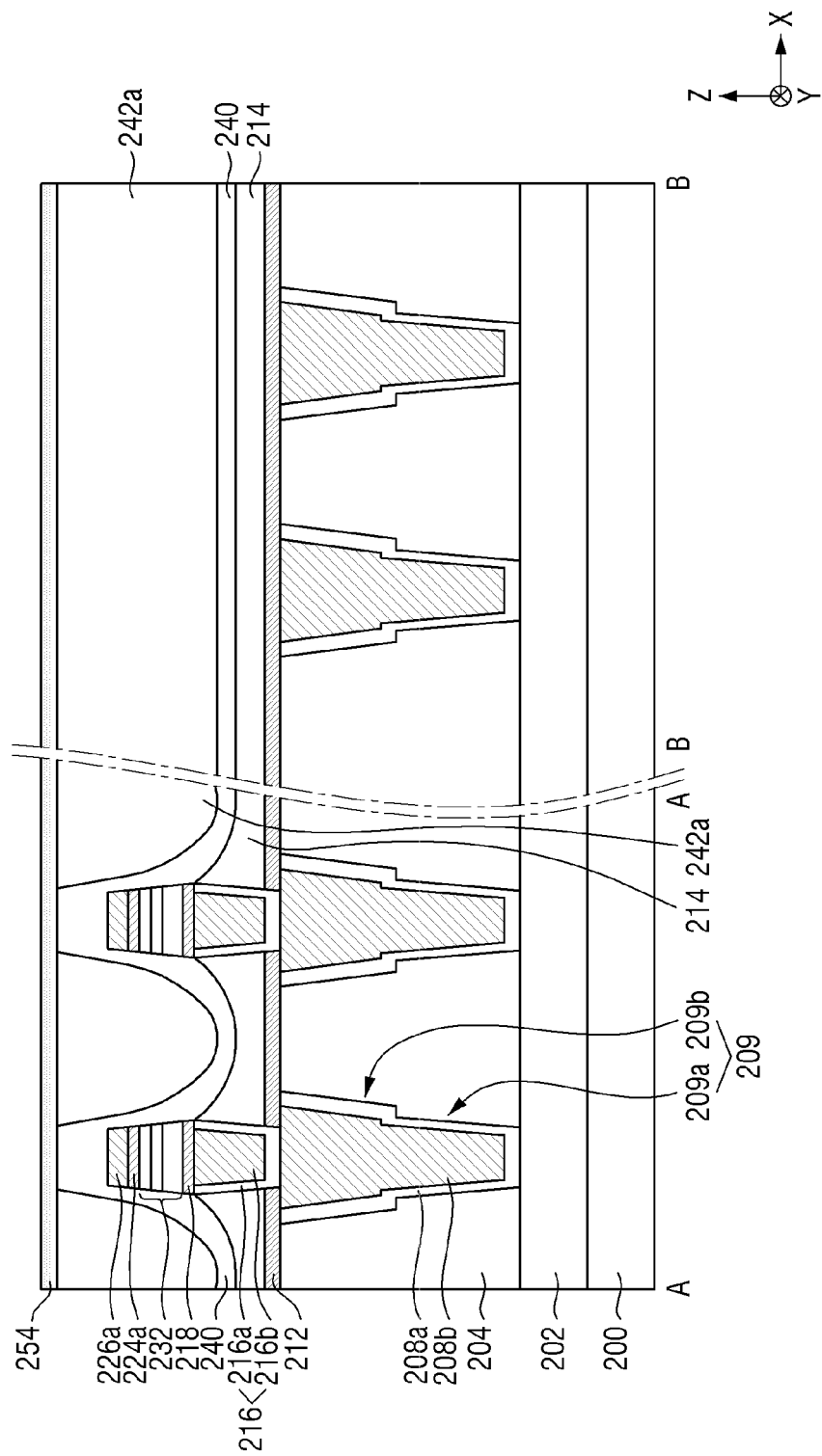
FIGS. 11 to 17 are cross-sectional diagrams of intermediate structures that illustrate methods of fabricating electronic devices, according to some embodiments.

Referring to FIG. 11, the lower electrode contact 216, the first mold insulating film 214, the MTJ element MTJE, the capping film 240, the second mold insulating film 242a, and the etching stop layer 254 may be formed on the first etching stop layer 212. Here, the first mold insulating film 214, the capping film 240, the second mold insulating film 242a and the etching stop layer 254 may be formed in both the cell region CR and the core peripheral region CPR, but the lower electrode contact 216 and the MTJ element MTJE may be formed only in the cell region CR.

The first mold insulating film 214 and the capping film 240 of the cell region CR may be formed in a recessed manner, but the first mold insulating film 214, the capping film 240 and the second mold insulating film 242a of the core peripheral region CPR may be formed to be parallel to the first etching stop layer 212. However, the embodiments of the present disclosure are not limited thereto.

Figure 12:
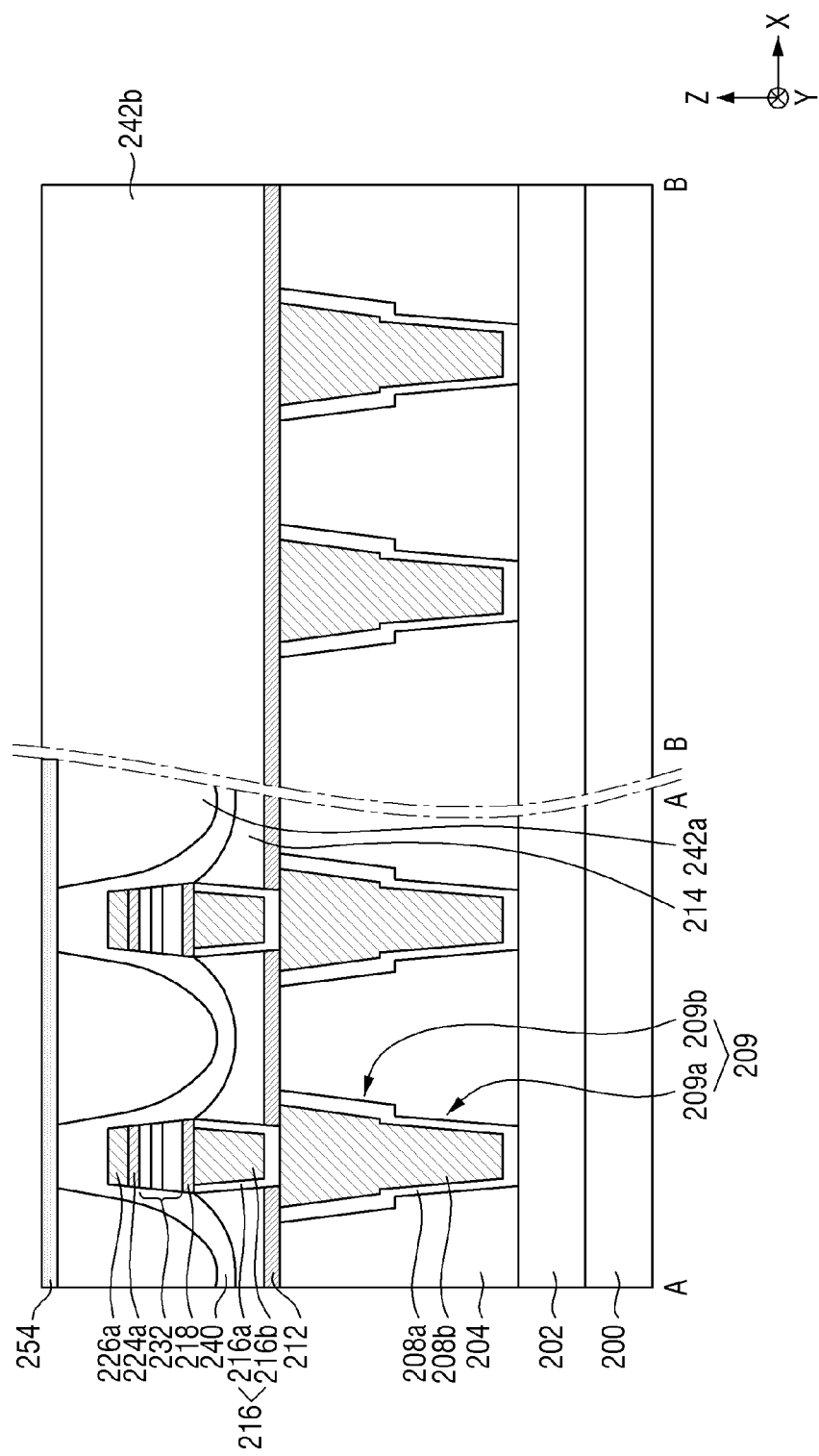

Referring to FIG. 12, the first mold insulating film 214, the capping film 240, the second mold insulating film 242a and the etching stop layer 254 of the core peripheral region CPR may be replaced with the third mold insulating film 242b. Here, the third mold insulating film 242b may include a material different from the second mold insulating film 242a, and they may be separated from each other. The upper surface of the third mold insulating film 242b may be parallel to the upper surface of the etching stop layer 254 of the cell region CR.

Figure 13:
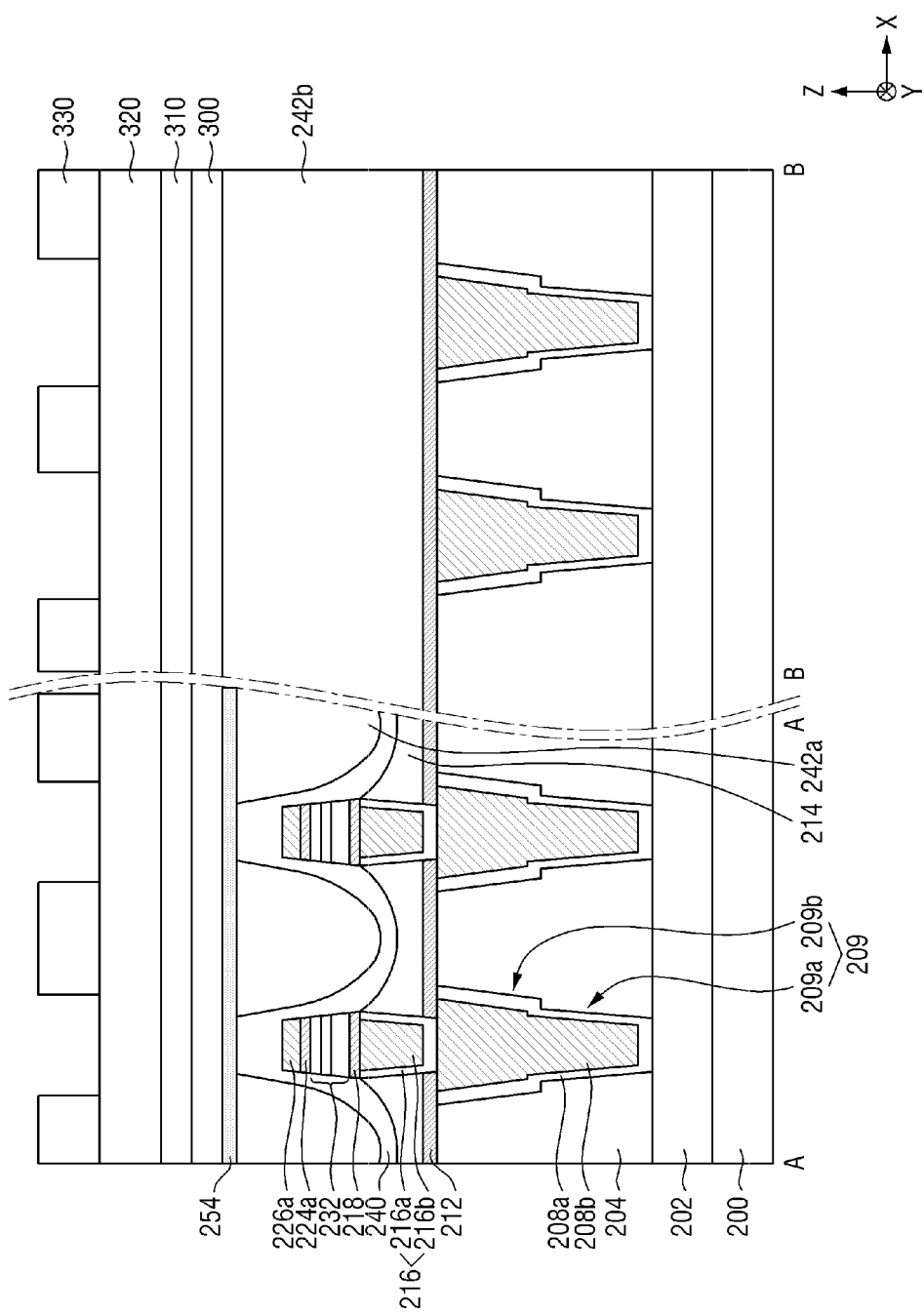

Referring to FIG. 13, an antireflection film 300, a mask film 310, a pattern layer 320, and a photoresist 330 may be formed on the etching stop layer 254 of the cell region CR and the third mold insulating film 242b of the core peripheral region CPR. Here, the antireflection film 300, the mask film 310, the pattern layer 320 and the photoresist 330 may be sequentially stacked. The antireflection film 300 may include silicon oxynitride (SiON). The antireflection film 300 may be formed through a CVD process or the like. The mask film 310 may include a metal material.

The pattern layer 320 may be formed on the mask film 310. For example, the pattern layer 320 may be formed of a carbon-spin on hardmask material consisting of about 99% carbon. For example, the pattern layer 320 may be a first spin-on hardmask (first SOH) material. The photoresist 330 may be formed on the pattern layer 320. The exposure process using the photoresist 330 may be performed on the electronic device 1.

Figure 14:
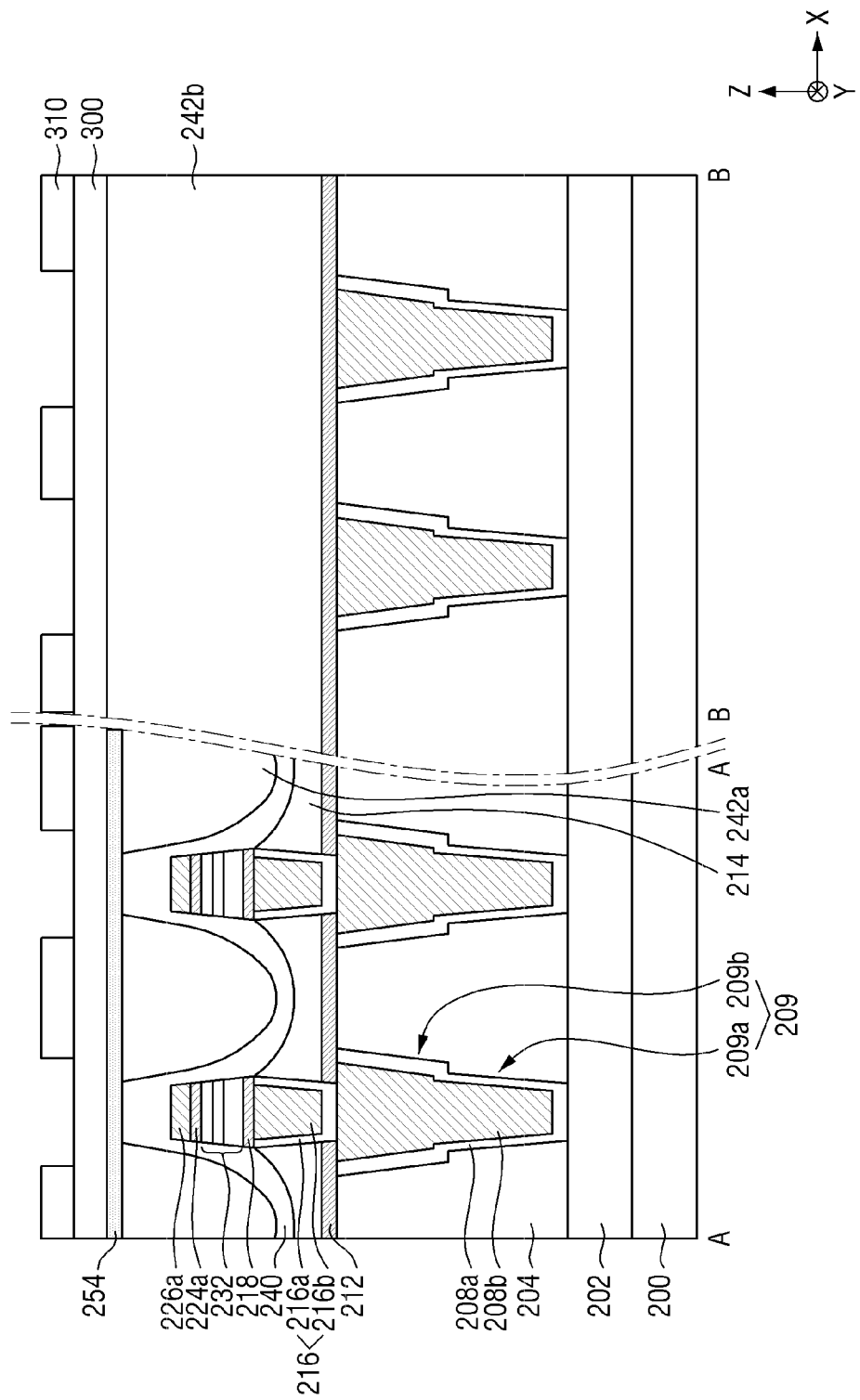
Figure 15:
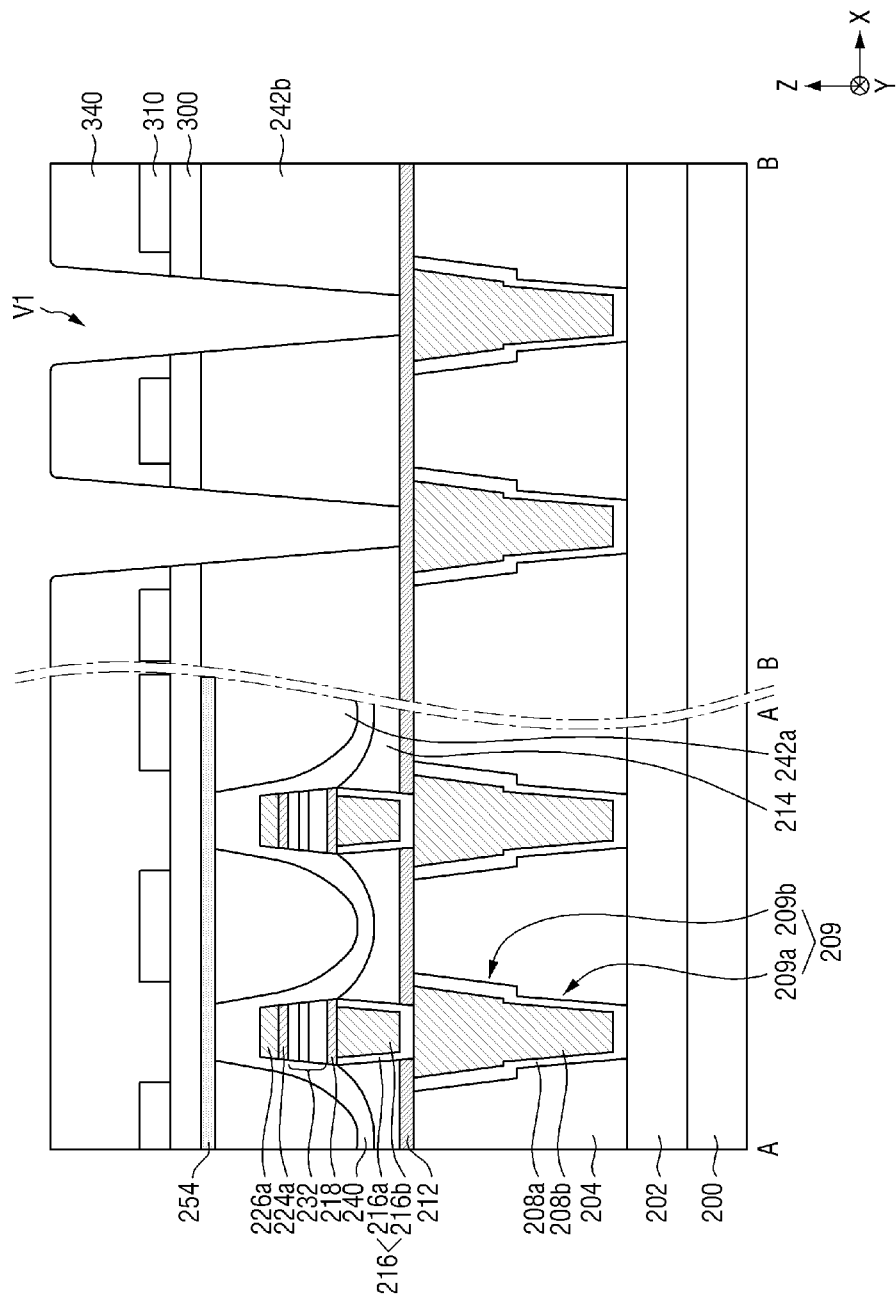

Referring to FIG. 14, the mask film 310 may be patterned after the exposure process. That is, the mask film 310 may be etched. Referring to FIG. 15, the antireflection film 300 and the third mold insulating film 242b may be etched after the pattern layer 340 is formed on the mask film 310. Accordingly, a first via V1 may be formed inside the pattern layer 340, the antireflection film 300, and the third mold insulating film 242b. Here, the first etching stop layer 212 may be exposed by the first via V1. The first via V1 may be formed in the core peripheral region CPR and may not be formed in the cell region CR. The third mold insulating film 242b may be etched accordingly.

Figure 16:
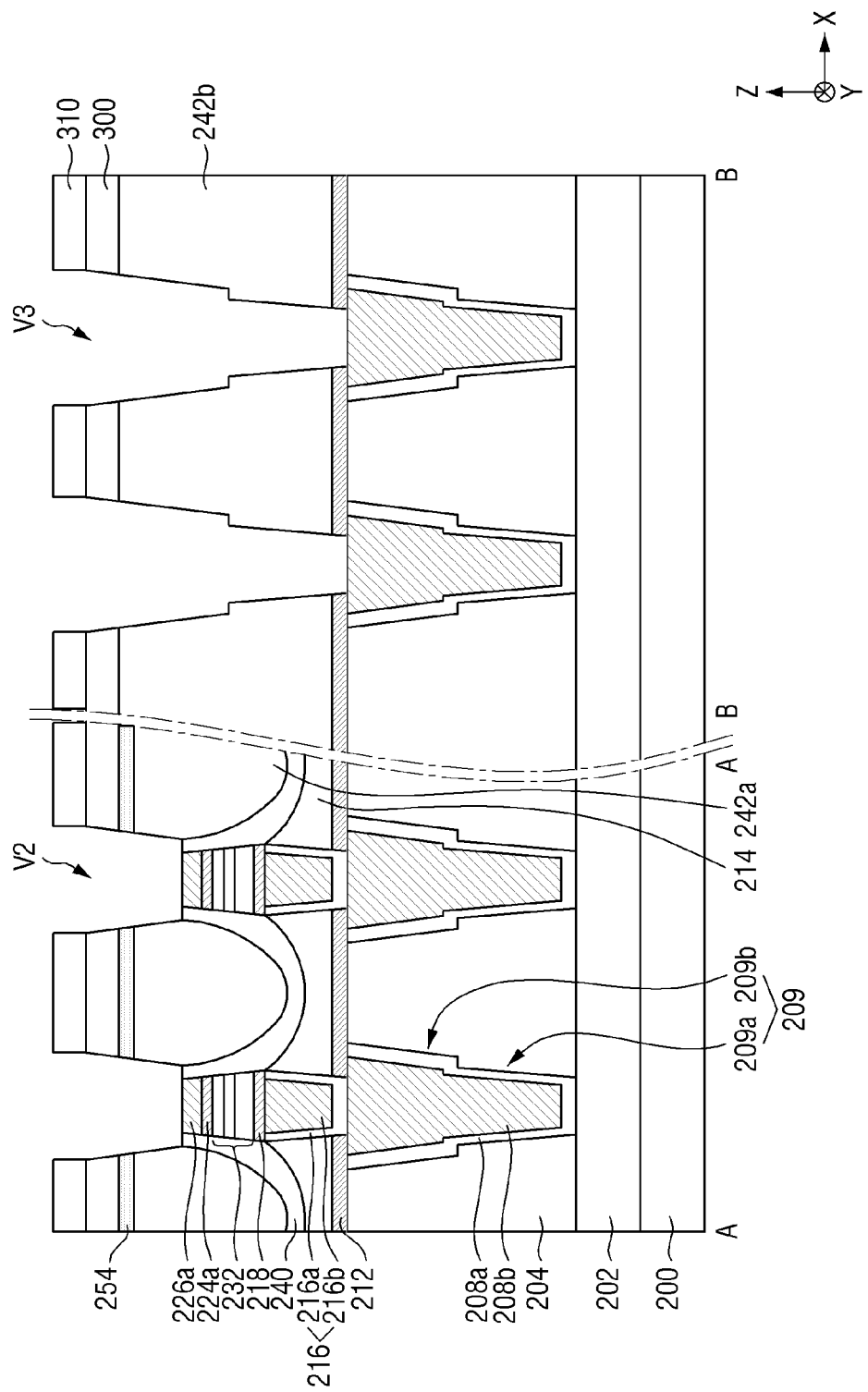

Referring to FIG. 16, a second via V2 and a third via V3 may be formed by performing the etching using the mask film 310. The second via V2 may be formed in the cell region CR, and the third via V3 may be formed in the core peripheral region CPR. The second via V2 may be formed in the antireflection film 300, the etching stop layer 254 and the second mold insulating film 242a of the cell region CR. The second via V2 may expose the upper surfaces of the MTJ element MTJE and the capping film 240. The third via V3 may be formed inside the antireflection film 300, the third mold insulating film 242b and the first etching stop layer 212 of the core peripheral region CPR. The third via V3 may expose the upper surface of the third lower wiring 209 of the core peripheral region CPR. The third via V3 may include vias having different widths from each other.

Figure 17:
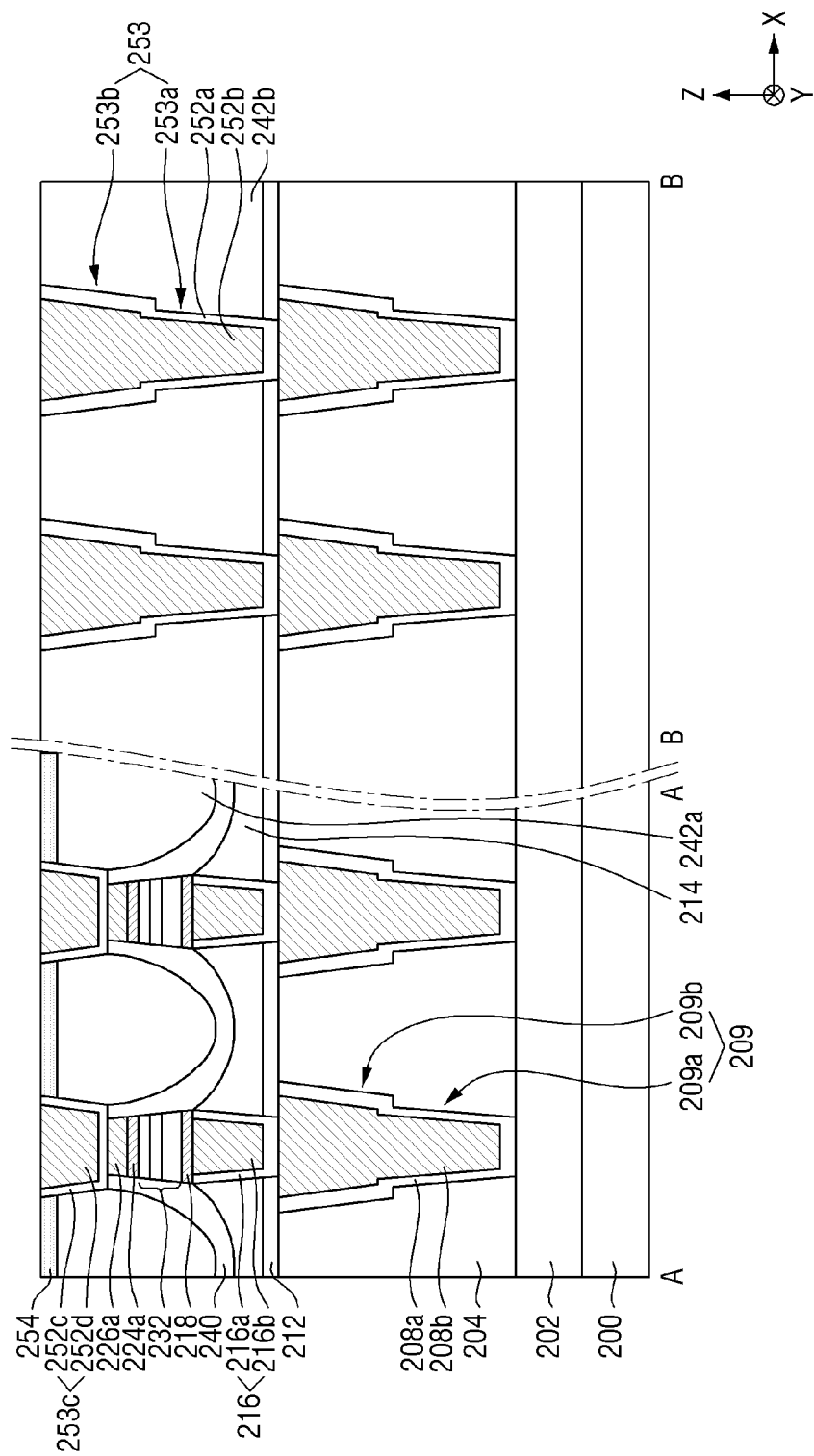

Referring to FIG. 17, the antireflection film 300 and the mask film 310 may be removed, and the second via V2 and third via V3 may be filled. The first metal structure 253c may be formed in the second via V2, and the first metal wiring structure 253 may be formed in the third via V3. Accordingly, the first metal structure 253c may be in contact with the upper surfaces of the MTJ element MTJE and the capping film 240, and the first metal wiring structure 253 may be in contact with the upper surface of the third lower wiring 209. That is, the first metal structure 253c of the cell region CR and the first metal wiring structure 253 of the core peripheral region CPR may be formed by the same process. The difficulty level of the process may be further reduced accordingly.

Hereinafter, the electronic device 1 according to some embodiments will be explained referring to FIGS. 18 and 19, which are cross-sectional views of the electronic device according to some embodiments. For convenience of explanation, repeated parts of contents explained using FIGS. 1 to 17 will be briefly described or omitted.

Figure 18:
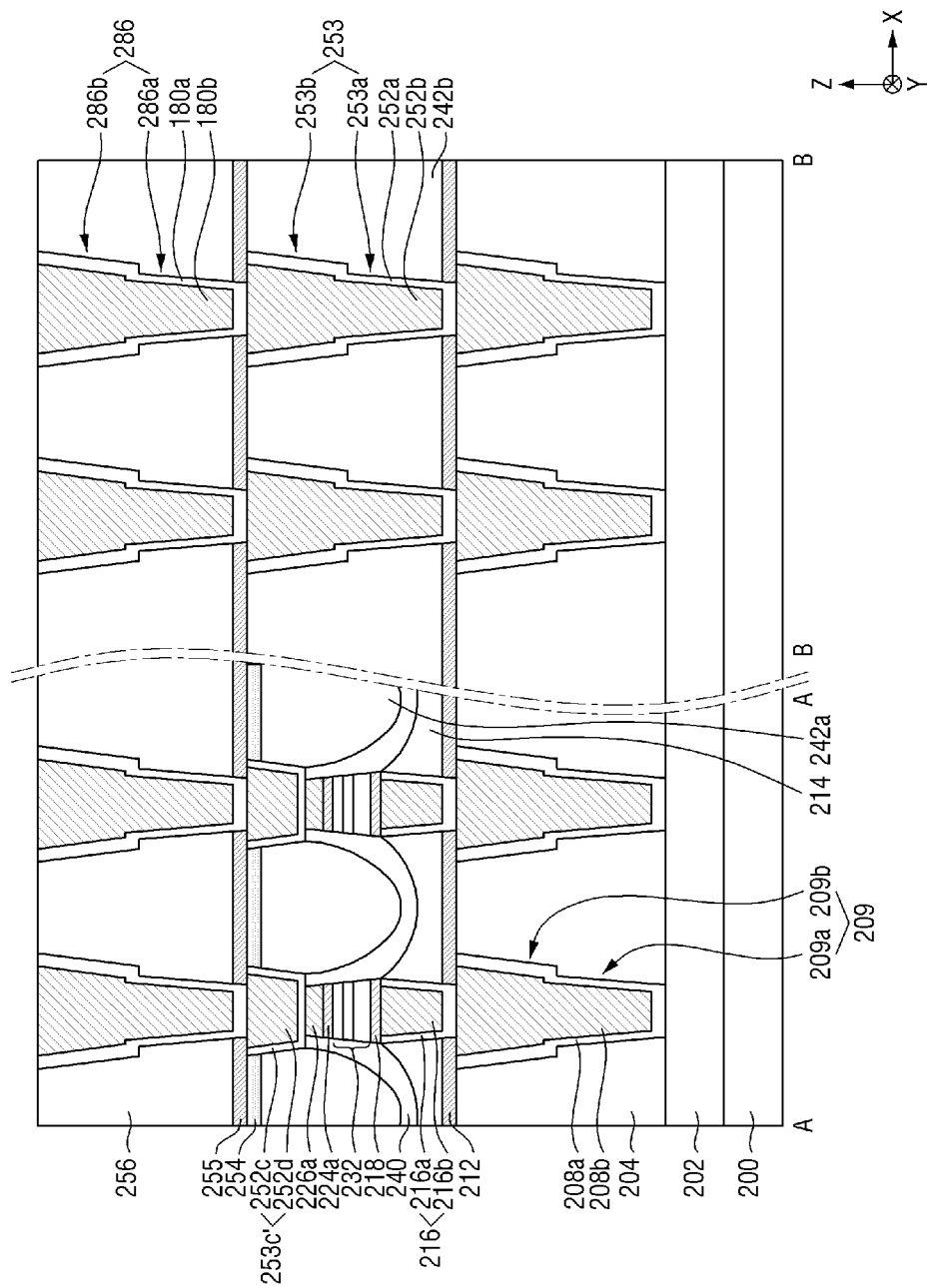
FIGS. 18 and 19 are cross-sectional views of the electronic device according to some embodiments.
Figure 19:
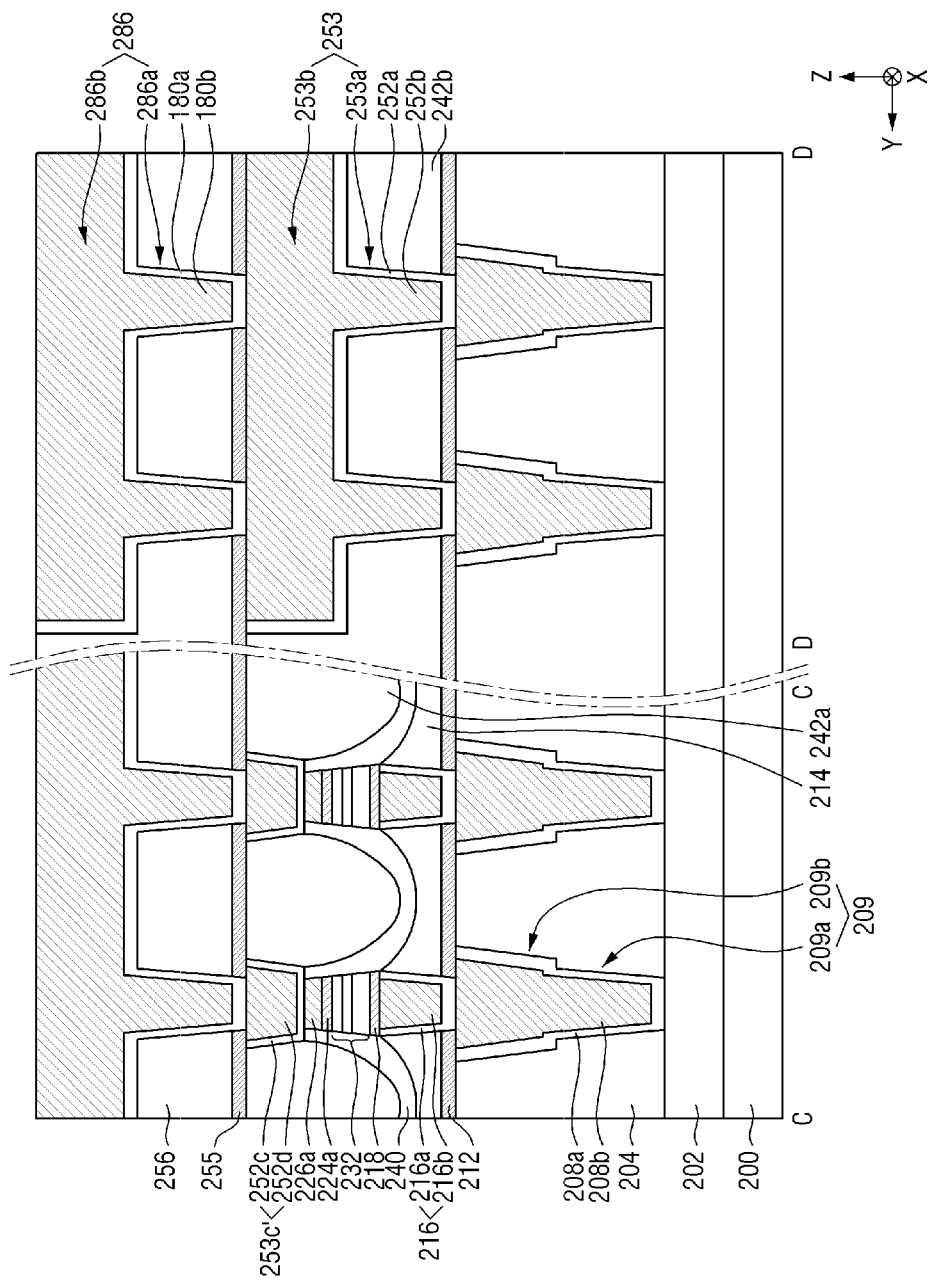

Referring to FIGS. 18 and 19, the electronic device 1 may include a via contact 253c'. The electronic device 1 explained referring to FIGS. 1 to 10 includes a first metal structure 253c, whereas the via contact 253c' may have a via shape. That is, the third structure 253c has a line shape formed by extending long in the second direction Y, whereas the via contact 253c' may not extend long in the second direction Y. For example, a width of the via contact 253c' in the first direction X and a width in the second direction Y may be substantially the same. The via contact 253c' may directly connect the MTJ element MTJE to the second metal wiring structure 286.

Figure 20:
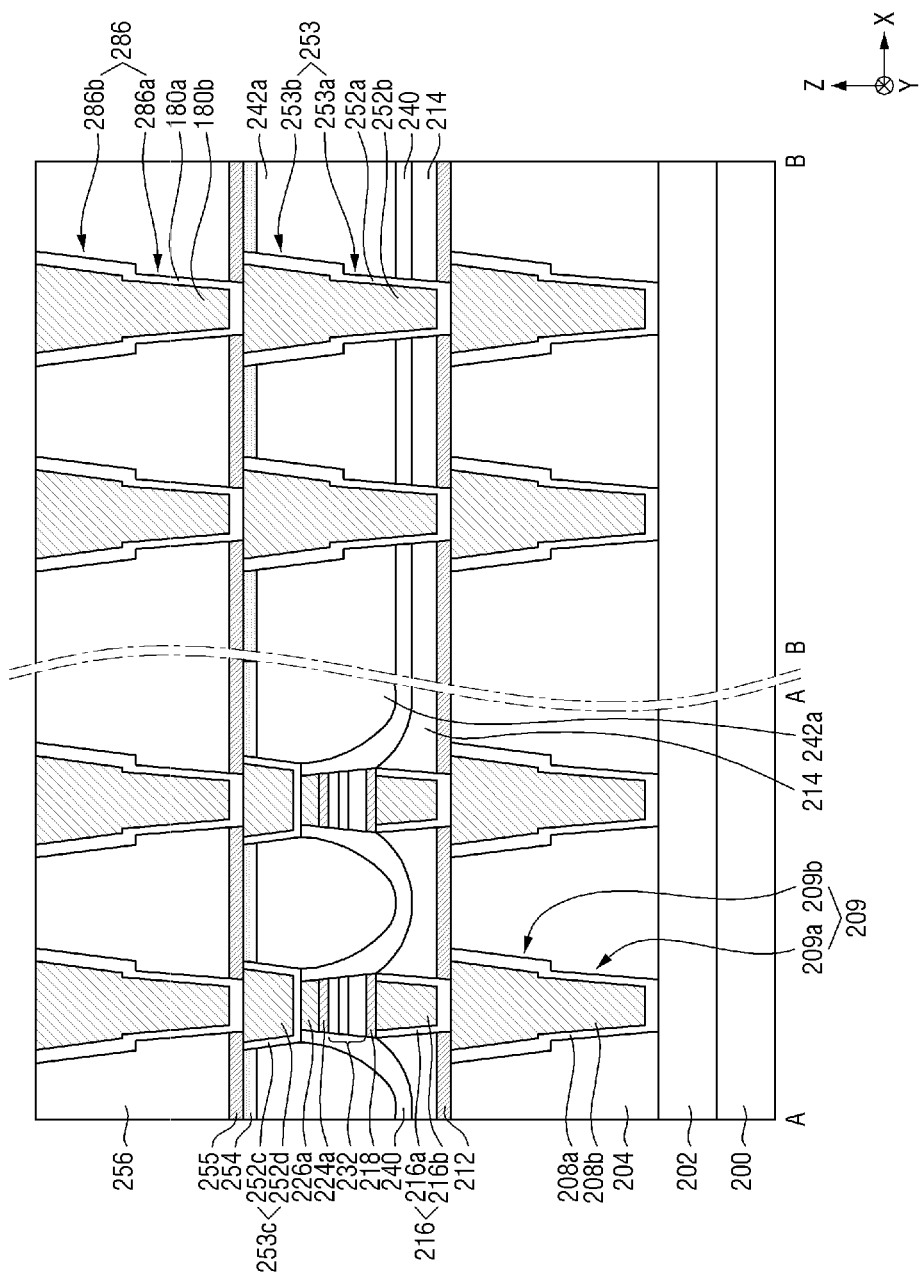
FIGS. 20 and 21 are cross-sectional views of the electronic device according to some embodiments.
Figure 21:
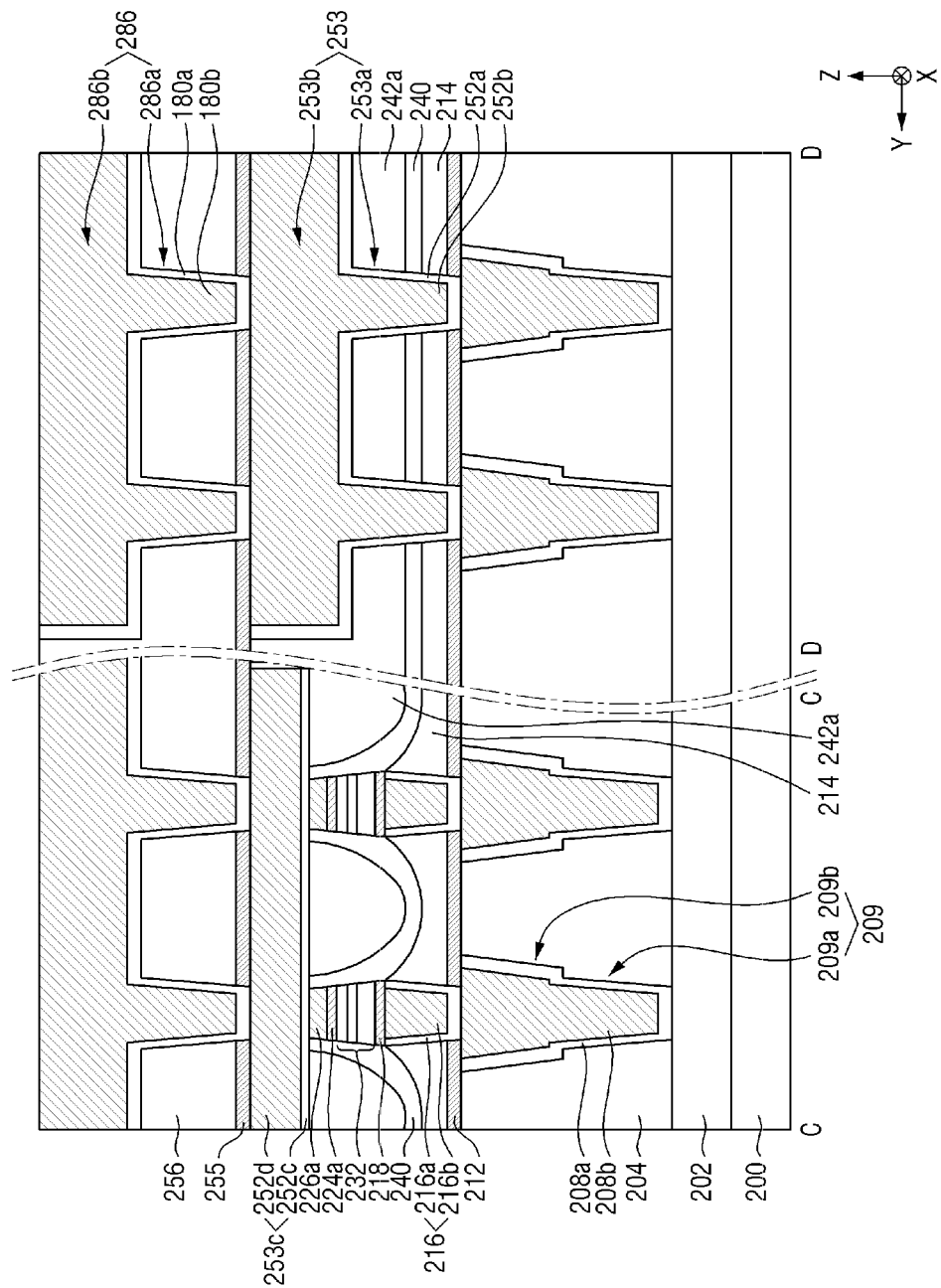

Hereinafter, the electronic device 1 according to some embodiments will be explained referring to FIGS. 20 and 21, where FIGS. 20 and 21 are cross-sectional views of the electronic device according to some embodiments. For convenience of explanation, repeated parts of contents explained using FIGS. 1 to 17 will be briefly described or omitted.

Referring to FIGS. 20 and 21, the electronic device 1 may include a first mold insulating film 214, a capping film 240, a second mold insulating film 242a, and an etching stop layer 254 that are formed in the core peripheral region CPR. Unlike the configuration in which the core peripheral region CPR of the electronic device 1 explained referring to FIGS. 1 to 17 includes a third mold insulating film 242b instead of the first mold insulating film 214, the capping film 240, the second mold insulating film 242a, and the etching stop layer 254, the electronic device 1 may not include the third mold insulating film 242b.

The first mold insulating film 214, the capping film 240, the second mold insulating film 242a and the etching stop layer 254 may be stacked sequentially on the first etching stop layer 212 of the core peripheral region CPR. Here, the replacement process may not be performed. The first metal wiring structure 253 may be formed in the first mold insulating film 214, the capping film 240, the second mold insulating film 242a and the etching stop layer 254.

In concluding the detailed description, those skilled in the art will appreciate that many variations and modifications may be made to the preferred embodiments without substantially departing from the principles of the present disclosure. Therefore, the disclosed preferred embodiments of the invention are used in a generic and descriptive sense only and not for purposes of limitation.

What is claimed is:

1. A magnetic memory device, comprising:
a substrate having a first mold insulating film on a first region thereof;
a first structure on the substrate, said first structure including a lower electrode, a magnetic tunnel junction (MTJ) structure on the lower electrode, and an upper electrode on the MTJ structure;
a capping film, which extends on the first mold insulating film and sidewalls of the first structure, has an uppermost surface coplanar with an upper surface of the upper electrode, and has a recessed utter surface that is generally conformal with an underlying recessed portion of the first mold insulating film;
a first etching stop layer on the first structure and the capping film;
a second mold insulating film, which at least partially fills a space between the capping film and the first etching stop layer;
a first metal structure, which extends through a portion of the first etching stop layer and a portion of the second mold insulating film, and is electrically coupled to the upper electrode; and
a second etching stop layer, which covers and is in contact with an upper surface of the first metal structure.

2. The device of claim 1, further comprising:
a lower electrode contact within the first mold insulating film, said lower electrode contact electrically coupled to the lower electrode within the first structure;
a third mold insulating film on a second region of the substrate;
a first via contact within the third mold insulating film; and
a first metal wiring, which extends on the first via contact and within the third mold insulating film;
wherein the second and third mold insulating films are different mold insulating films; and
wherein a first height of the first metal structure relative to the substrate is less than a second height of the first metal wiring relative to the substrate.

3. The device of claim 2, wherein:
the third mold insulating film is in contact with the capping film, the first mold insulating film, the second mold insulating film, and the first etching stop layer;
the second mold insulating film is separated from the sidewalls of the first structure by the capping film, and is in contact with a lower surface of first etching stop layer and an upper surface of the capping film; and
the capping film is in contact with an upper surface of first mold insulating film and sidewalls of the first structure.

4. The device of claim 2, wherein the first etching stop layer extends along an upper surface of the second mold insulating film, but does not extend along an upper surface of the third mold insulating film.

5. The device of claim 2, wherein a width of the first via contact is smaller than a width of the first metal wiring.

6. The device of claim 1, wherein the first metal structure is in contact with an upper surface of the first structure and the capping film.

7. The device of claim 2, wherein the second etching stop layer covers and is in contact with upper surfaces of the first etching stop layer, the third mold insulating film, and the first metal wiring; and wherein thicknesses of the first and second etching stop layers on the first region of the substrate are greater than a thickness of the second etching stop layer on the second region of the substrate.

8. The device of claim 7, further comprising:
a fourth mold insulating film on the second etching stop layer;
a second via contact, which is disposed in the second etching stop layer and in the fourth mold insulating film, and is in contact with the upper surface of the first metal structure; and
a second metal wiring, which is disposed in the fourth mold insulating film and is in contact with an upper surface of the second via contact; and
wherein a width of the second via contact is smaller than a width of the first metal structure and a width of the second metal wiring.

9. The device of claim 2, wherein the first region is a memory region, and the second region is a logic region.

10. The device of claim 1, wherein the first metal structure is a metal via contact.

11. A magnetic memory device comprising:
a substrate including a first region and a second region;
a first mold insulating film on the first region and the second region;
a lower electrode contact in the first mold insulating film of the first region;
a first structure which is disposed on the lower electrode contact, and includes a lower electrode, a magnetic tunnel junction structure and an upper electrode;
a capping film, which extends along and in contact with an upper surface of the first mold insulating film on the first region and the second region, on side walls of the first structure, and surrounds the first structure, said capping film having an uppermost surface coplanar with an upper surface of the upper electrode, and a recessed upper surface that is generally conformal with an underlying recessed portion of the first mold insulating film;
a first etching stop layer on the capping film;
a second mold insulating film, which at least partially fills a space between the first etching stop layer and the capping film;
a first metal structure, which is disposed in the first etching stop layer and the second mold insulating film, and is in contact with an upper surface of the first structure;
a first via contact disposed in the first mold insulating film, the capping film and the second mold insulating film; and
a first metal wiring, which is disposed in the second mold insulating film and the first etching stop layer, and is disposed on the first via contact;
wherein a first height of the first metal structure is smaller than a second height of the first metal wiring, and
a second etching stop layer which includes a first area in contact with an upper surface of the first etching stop layer and a second area in contact with an upper surface of the first metal structure.

12. The device of claim 11, wherein the first etching stop layer is formed along the second mold insulating film of the first region and the second region, and surrounds the first metal structure and the first metal wiring.

13. The device of claim 12, wherein the upper surface of the first metal structure and an upper surface of the first metal wiring are exposed from the first etching stop layer.

14. The device of claim 11, wherein the second etching stop layer covers the upper surface of the first etching stop layer and covers at least a part of the upper surface of the first metal structure and the upper surface of the first metal wiring.

15. The device of claim 14, further comprising:
a third mold insulating film on the second etching stop layer;
a second via contact, which is disposed in the second etching stop layer and the third mold insulating film, and is in contact with the upper surface of the first metal structure; and
a second metal wiring, which is disposed in the third mold insulating film and is in contact with an upper surface of the second via contact; and
wherein a width of the second via contact is smaller than a width of the first metal structure and a width of the second metal wiring.

16. The device of claim 11, wherein the capping film is in contact with a lower surface of the first metal structure and is not in contact with side walls of the first metal structure.

17. The magnetic memory device of claim 11, wherein the first metal structure is in contact with the upper surface of the first structure and the capping film.

18. An electronic device comprising:
a logic region; and
a memory region connected to the logic region;
wherein the memory region is embedded in the electronic device, and includes a cell region and a core peripheral region;
wherein the cell region includes:
a first substrate;
a first mold insulating film on the first substrate;
a lower electrode contact in the first mold insulating film;
a first structure, which is disposed on the lower electrode contact and includes a lower electrode, a magnetic tunnel junction structure and an upper electrode;
a capping film which is formed along an upper surface of the first mold insulating film and side walls of the first structure and surrounds the first structure, said capping film having an uppermost surface coplanar with an upper surface of the upper electrode, and a recessed upper surface that is generally conformal with an underlying recessed portion of the first mold insulating film;
a first etching stop layer on the first structure and the capping film;
a second mold insulating film, which at least partially fills a space between the first etching stop layer and the capping film; and
a first metal structure, which is formed in the first etching stop layer and the second mold insulating film, and is in contact with an upper surface of the first structure,
wherein the core peripheral region includes:
a second substrate;
a third mold insulating film on the second substrate;
a first via contact in the third mold insulating film; and
a first metal wiring, which is disposed in the third mold insulating film and is disposed on the first via contact;
wherein the third mold insulating film is different from the second mold insulating film; and
wherein a first height of the first metal structure is smaller than a second height of the first metal wiring; and
a second etching stop layer which includes a first area in contact with an upper surface of the first etching stop layer and a second area in contact with an upper surface of the first metal structure.

19. The device of claim 18,
wherein the logic region includes:
a third substrate;
a fourth mold insulating film on the third substrate;
a second via contact in the fourth mold insulating film; and
a second metal wiring disposed in the fourth mold insulating film and disposed on the second via contact;
wherein the fourth mold insulating film is different from the second mold insulating film; and
wherein the first height of the first metal structure is smaller than the third height of the second metal wiring.

20. The device of claim 18, wherein the first and second substrates are disposed on the same plane; and wherein the cell region and the core peripheral region are formed at the same level.

* * * * *